(12) United States Patent
Kobayashi et al.

(10) Patent No.: US 10,418,521 B2
(45) Date of Patent: Sep. 17, 2019

(54) METHOD FOR MANUFACTURING SUBSTRATE AND METHOD FOR MANUFACTURING LIGHT EMITTING ELEMENT USING SAME

(71) Applicant: TORAY INDUSTRIES, INC., Tokyo (JP)

(72) Inventors: Hideyuki Kobayashi, Otsu (JP); Tomoyuki Yuba, Otsu (JP)

(73) Assignee: TORAY INDUSTRIES, INC. (JP)

( * ) Notice: Subject to any disclaimer, the term of this patent is extended or adjusted under 35 U.S.C. 154(b) by 0 days.

(21) Appl. No.: 15/770,248

(22) PCT Filed: Oct. 27, 2016

(86) PCT No.: PCT/JP2016/081898
§ 371 (c)(1),
(2) Date: Apr. 23, 2018

(87) PCT Pub. No.: WO2017/073674
PCT Pub. Date: May 4, 2017

(65) Prior Publication Data
US 2018/0309022 A1    Oct. 25, 2018

(30) Foreign Application Priority Data
Oct. 30, 2015   (JP) .................................. 2015-214055

(51) Int. Cl.
*H01L 33/24*   (2010.01)
*C08G 65/18*   (2006.01)
(Continued)

(52) U.S. Cl.
CPC .............. *H01L 33/24* (2013.01); *C08G 65/18* (2013.01); *C08G 69/28* (2013.01); *C08K 5/1525* (2013.01);
(Continued)

(58) Field of Classification Search
CPC .................... H01L 21/02118; H01L 21/312; H01L 21/47; H01L 33/24; H01L 33/0075;
(Continued)

(56) References Cited

U.S. PATENT DOCUMENTS

| | | | |
|---|---|---|---|
| 5,756,254 A * | 5/1998 | Kihara | ................. G03F 7/0045 430/270.1 |
| 2003/0027425 A1* | 2/2003 | Kawanishi | ............... B24C 1/04 438/699 |

(Continued)

FOREIGN PATENT DOCUMENTS

| | | | |
|---|---|---|---|
| JP | 3595277 B2 | 12/2004 | |
| JP | 2007106779 A | 4/2007 | |

(Continued)

OTHER PUBLICATIONS

International Search Report and Written Opinion for International Application No. PCT/JP2016/081898, dated Jan. 24, 2017, 6 pages.
(Continued)

*Primary Examiner* — Dale E Page
*Assistant Examiner* — Quovaunda Jefferson
(74) *Attorney, Agent, or Firm* — RatnerPrestia

(57) ABSTRACT

A method of producing a patterned substrate includes the steps of: providing, on a substrate, a coating film of a resin composition including (A) an alkali-soluble resin selected from the group consisting of polyimides, polyamideimides, polyimide precursors, polyamideimide precursors, polybenzoxazoles, polybenzoxazole precursors, copolymers of at least two of the resins, and copolymers of at least one of the resins and another structural unit, (B) a photoacid generator, and (C) at least one compound selected from the group consisting of epoxy compounds and oxetane compounds; forming a pattern of the coating film; patterning the substrate through etching using the pattern of the coating film as a
(Continued)

mask; and removing the coating film of the resin composition.

14 Claims, 1 Drawing Sheet

(51) Int. Cl.

| | | |
|---|---|---|
| C08K 5/1525 | (2006.01) | |
| C08L 63/00 | (2006.01) | |
| C08L 79/04 | (2006.01) | |
| C08L 79/08 | (2006.01) | |
| G03F 7/40 | (2006.01) | |
| C08G 69/28 | (2006.01) | |
| C09D 177/06 | (2006.01) | |
| G03F 7/039 | (2006.01) | |
| G03F 7/16 | (2006.01) | |
| G03F 7/20 | (2006.01) | |
| G03F 7/32 | (2006.01) | |
| H01L 33/00 | (2010.01) | |
| H01L 33/12 | (2010.01) | |
| G03F 7/022 | (2006.01) | |
| G03F 7/023 | (2006.01) | |
| C08K 5/41 | (2006.01) | |
| G03F 7/075 | (2006.01) | |

(52) U.S. Cl.
CPC ............... *C08L 63/00* (2013.01); *C08L 79/04* (2013.01); *C08L 79/08* (2013.01); *C09D 177/06* (2013.01); *G03F 7/0226* (2013.01); *G03F 7/0233* (2013.01); *G03F 7/039* (2013.01); *G03F 7/162* (2013.01); *G03F 7/168* (2013.01); *G03F 7/2004* (2013.01); *G03F 7/322* (2013.01); *G03F 7/40* (2013.01); *H01L 33/0075* (2013.01); *H01L 33/12* (2013.01); *C08K 5/41* (2013.01); *G03F 7/0755* (2013.01)

(58) Field of Classification Search
CPC ....... H01L 33/12; G03F 3/103; G03F 7/0002; G03F 3/039; G03F 3/162; G03F 3/168; G03F 3/2004; G03F 3/322; G03F 3/0755; C08G 65/18; C08G 69/128; C08K 5/1525; C08K 5/41; C08L 63/00; C09D 177/06
See application file for complete search history.

(56) References Cited

U.S. PATENT DOCUMENTS

| | | | |
|---|---|---|---|
| 2006/0269868 A1 | 11/2006 | Hasegawa et al. | |
| 2009/0166818 A1* | 7/2009 | Banba | G03F 7/0233 257/642 |
| 2010/0006870 A1* | 1/2010 | Lee | H01L 27/153 257/88 |
| 2012/0288798 A1 | 11/2012 | Kotani et al. | |
| 2015/0362836 A1 | 12/2015 | Tsuchimura et al. | |

FOREIGN PATENT DOCUMENTS

| | | |
|---|---|---|
| JP | 2008083467 A | 4/2008 |
| JP | 2008107512 A | 5/2008 |
| JP | 2008145579 A | 6/2008 |
| JP | 2011091374 A | 5/2011 |
| JP | 2014163999 A | 9/2014 |
| JP | 2014170080 A | 9/2014 |
| JP | 2014191002 A | 10/2014 |
| WO | 2005057642 A1 | 6/2005 |

OTHER PUBLICATIONS

Extended European Search Report for European Application No. 16 859 903.3, dated Apr. 29, 2019, 8 pages.
Communication pursuant to Rules 70(2) and 70a(2) for European Application No. 16 859 903.3, dated May 16, 2019, one page.

* cited by examiner

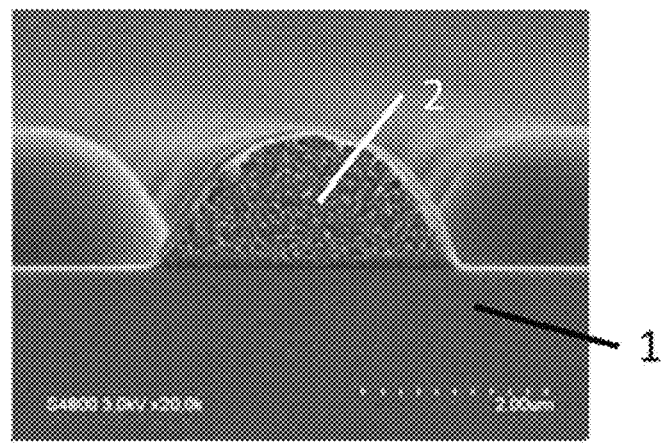

METHOD FOR MANUFACTURING SUBSTRATE AND METHOD FOR MANUFACTURING LIGHT EMITTING ELEMENT USING SAME

CROSS REFERENCE TO RELATED APPLICATIONS

This is the U.S. National Phase application of PCT/JP2016/081898, filed Oct. 27, 2016, which claims priority to Japanese Patent Application No. 2015-214055, filed Oct. 30, 2015, the disclosures of these applications being incorporated herein by reference in their entireties for all purposes.

TECHNICAL FIELD OF THE INVENTION

The present invention relates to methods of producing substrates using specific resin compositions and methods of producing light emitting elements.

BACKGROUND OF THE INVENTION

A light emitting diode (LED) is one kind of element that converts electrical energy to light energy by utilizing the characteristics of semiconductors. Because LEDs have a good energy conversion efficiency and a long life, they are becoming more and more popular in applications for various kinds of electronic equipment such as lighting devices, illuminations, and displays. This is demanding in recent years that light emitting elements used for LEDs have even higher brightness.

Light emitting elements used for such LEDs have a structure in which an n-type semiconductor layer such as an n-type GaN layer, a light emitting layer such as an InGaN layer, and a p-type semiconductor layer such as a p-type GaN layer are formed in this order on a substrate, and electrons injected from the n-type semiconductor layer and positive holes injected from the p-type semiconductor layer are recombined in the light emitting layer, whereby light is emitted.

With light emitting elements having such a structure, a technology is known in which a GaN-based semiconductor layer is formed using an epitaxial growth method for growing a GaN-based semiconductor crystal on a substrate crystal such that the semiconductor crystal is oriented in the same arrangement as the crystalline face of the substrate base material. As substrates for crystal growth, single crystal sapphire substrates having excellent characteristics in terms of mechanical and thermal characteristics, chemical stability, and optical transparency are used in many cases.

There is a problem, however, in that the crystal growth of a GaN layer on a single crystal sapphire substrate disturbs the GaN crystal orientation during the growth and causes defects because there is a difference between the crystal lattice constant of sapphire and that of GaN. There is also a problem in that the difference between the refractive index of the sapphire substrate and that of the GaN-based semiconductor layer causes light emitted from the light emitting layer to be totally reflected at the interface between the sapphire layer and the GaN-based semiconductor layer, whereby the light is confined in the GaN-based semiconductor layer. These problems pose a challenge in that light to be taken outwardly is reduced.

As a method of enhancing the efficiency of taking out light from the light emitting layer, a method is known in which a resist pattern is formed on a sapphire substrate, and the pattern is used as a mask to carry out dry etching on the sapphire substrate, whereby a convex pattern is formed on the surface of the sapphire substrate (see, for example, Patent Document 1 to 3). The formation of a convex pattern promotes crystal dislocation along with the convex pattern when a GaN-based semiconductor layer is formed, and thus reduces the defects of the GaN layer when compared with the use of a smooth sapphire substrate. In addition, scattering and diffracting light emitted from the light emitting layer enables suppression of total reflection at the layer interface.

PATENT DOCUMENTS

Patent Document 1: JP 3595277 B2
Patent Document 2: JP 2011-91374 A
Patent Document 3: JP 2014-191002 A

SUMMARY OF INVENTION

The resist described in Patent Document 1 has a problem, however, in that dry etching carried out at a high output to shorten processes raises the temperature of the substrate and thus causes resist burning and carbonization, resulting in failing to afford a desired sapphire pattern.

Patent Document 2 describes a resist, with which a process for suppressing resist burning and carbonization is proposed, but with which a photolithography step needs to be followed by an additional step of carrying out UV curing together with heat treatment and further carrying out post-bake, and accordingly there is a problem in that the shortening of processes is insufficient.

The resist described in Patent Document 3 has a problem in that the resist pattern becomes rectangular, and the sapphire pattern formed after dry etching is also rectangular similarly, resulting in failing to afford a sufficient light scattering effect at the flat surface portion and in enhancing the light takeout efficiency insufficiently.

An object of the present invention is to provide a method of producing a patterned substrate the surface of which can afford a pattern having a curved cross-section, as a result of using a resin composition that can afford a cured film which is less likely to cause resist burning and carbonization even in high-output dry etching processing subject to a high temperature of 100° C. to 300° C. and which has good etching selectivity and post-etching removability.

To solve the problem, the present invention provides a method of producing a patterned substrate, the method including the steps of:

providing, on a substrate, a coating film of a resin composition including (A) an alkali-soluble resin selected from the group consisting of polyimides (a-1), polyamideimides (a-2), polyimide precursors (a-3), polyamideimide precursors (a-4), polybenzoxazoles (a-5), polybenzoxazole precursors (a-6), copolymers of at least two of (a-1) to (a-6), and copolymers of at least one of (a-1) to (a-6) and another structural unit, (B) a photoacid generator, and (C) at least one compound selected from the group consisting of epoxy compounds and oxetane compounds;

forming a pattern of the coating film;

patterning the substrate through etching using the pattern of the coating film as a mask; and removing the coating film of the resin composition.

In the method of producing a substrate according to the present invention, a substrate on the surface of which a good curved surface pattern is carved can be obtained by using a positive photosensitive resin composition which allows the photoresist pattern to be controlled in curved shape, does not cause resist burning nor carbonization even in heat treatment at 100° C. to 300° C., and can afford a cured pattern having excellent heat resistance.

BRIEF DESCRIPTION OF DRAWINGS

The FIGURE is a photographed cross-section of the pattern of a coating film obtained from the resin composition according to the present invention.

DETAILED DESCRIPTION OF EMBODIMENTS OF THE INVENTION

Resin compositions used in the production method according to the present invention are those which are described in the Solution to Problem section. The resin compositions are photosensitive, and coating films made thereof are photolithographed and developed, to thereby provide patterned coating films. Further heating provides cured patterns.

Below, each component of the resin composition according to the present invention will be described in detail. However, the following are examples, and the present invention is not to be limited thereto.

<Alkali-Soluble Resin (A)>

An alkali-soluble resin is preferably dissolvable at a concentration of 0.1% by mass or more in an aqueous solution of tetraammonium hydroxide having a concentration of 2.38% by mass.

The alkali-soluble resin (A) is selected from the group consisting of polyimides (a-1), polyamideimides (a-2), polyimide precursors (a-3), polyamideimide precursors (a-4), polybenzoxazoles (a-5), polybenzoxazole precursors (a-6), copolymers of at least two of (a-1) to (a-6), and copolymers of at least one of (a-1) to (a-6) and another structural unit.

The copolymers as mentioned here encompass all those in which copolymerizing structural units are linked in a block, random, or alternating manner. In a copolymer of at least one of (a-1) to (a-6) and another structural unit, the total of the (a-1) to (a-6) structural units is 60% by mass or more of the whole resin.

Polyimides (a-1), polyamideimides (a-2), and polybenzoxazoles (a-5) are obtained by allowing polyimide precursors (a-3), polyamideimide precursors (a-4), and polybenzoxazole precursors (a-6) respectively to undergo intramolecular ring closure reaction through heat-treatment and the like. The polyimide precursor (a-3) is a polymer obtained by allowing, for example, a diamine to react with a tetracarboxylic acid or a derivative thereof. The polyamideimide precursor (a-4) is a polymer obtained by allowing, for example, a diamine to react with a tricarboxylic acid or a derivative thereof. The polybenzoxazole precursor (a-6) is a polymer obtained by allowing, for example, a diamine having a hydroxyl group to react with a dicarboxylic acid or a derivative thereof.

Specific preferable examples of diamines include, but are not limited to: diamines having a hydroxyl group such as bis(3-amino-4-hydroxyphenyl)hexafluoro propane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl, bis(3-amino-4-hydroxyphenyl)fluorene, bis(4-amino-3-hydroxyphenyl)hexafluoro propane, bis(4-amino-3-hydroxyphenyl)sulfone, bis(4-amino-3-hydroxyphenyl)propane, bis(4-amino-3-hydroxyphenyl)methylene, bis(4-amino-3-hydroxyphenyl)ether, bis(4-amino-3-hydroxy)biphenyl, and bis(4-amino-3-hydroxyphenyl)fluorene; carboxyl-group-containing diamines such as 3,5-diaminobenzoic acid and 3-carboxy-4,4'-diaminodiphenyl ether; sulfonic-acid-containing diamines such as 3-sulfonic acid-4,4'-diaminodiphenyl ether; 3,4'-diaminodiphenyl ether, 4,4'-diaminodiphenyl ether, 3,3'-diaminodiphenyl ether, 3,4'-diaminodiphenylmethane, 4,4'-diaminodiphenylmethane, 3,3'-diaminodiphenylmethane, 3,4'-diaminodiphenylsulfone, 4,4'-diaminodiphenylsulfone, 3,3'-diaminodiphenylsulfone, 3,4'-diaminodiphenyl sulfide, 4,4'-diaminodiphenyl sulfide, 3,3'-diaminodiphenyl sulfide, 1,4-bis(4-aminophenoxy)benzene, m-phenylenediamine, p-phenylenediamine, 1,5-naphthalenediamine, 2,6-naphthalenediamine, bis[4-(4-aminophenoxy)phenyl]sulfone, bis[4-(3-aminophenoxy)phenyl]sulfone, 4,4'-bis(4-aminophenoxy)biphenyl, bis[4-(4-aminophenoxy)phenyl]ether, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',5,5'-tetramethyl-4,4'-diaminobiphenyl, 2,2'-di(trifluoromethyl)-4,4'-diaminobiphenyl; these compounds in which part of the hydrogen atoms of their aromatic ring is/are substituted with an alkyl group or a halogen atom; aliphatic diamines such as cyclohexyldiamine and methylene bis(cyclohexylamine); and the like.

As polybenzoxazole precursors (a-6), diamines having a hydroxyl group as above-mentioned are preferably used.

Specific preferable examples of tetracarboxylic acids or derivatives thereof include, but are not limited to: aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid; aliphatic tetracarboxylic acids such as cyclobutanetetracarboxylic acid, 1,2,3,4-cyclopentanetetracarboxylic acid, cyclohexanetetracarboxylic acid, bicyclo[2.2.1.]heptanetetracarboxylic acid, bicyclo[3.3.1.]tetracarboxylic acid, bicyclo[3.1.1.]hepto-2-enetetracarboxylic acid, bicyclo[2.2.2.]octanetetracarboxylic acid, and adamantanetetracarboxylic acid; dianhydrides of these tetracarboxylic acids; and the like.

Specific preferable examples of tricarboxylic acids or derivatives thereof include, but are not limited to: trimellitic acid, trimesic acid, diphenyl ether tricarboxylic acid, biphenyltricarboxylic acid, anhydrides of these tricarboxylic acids, and the like.

Specific preferable examples of dicarboxylic acids or derivatives thereof include, but are not limited to: terephthalic acid, isophthalic acid, diphenyl ether dicarboxylic acid, diphenylsulfonedicarboxylic acid, diphenylmethanedicarboxylic acid, biphenyldicarboxylic acid, 2,2'-bis(carboxyphenyl)propane, 2,2'-bis(carboxyphenyl)hexafluoropropane, and the like.

Among these, those which have as a main component a structural unit represented by the general formula (1) are more preferable as alkali-soluble resins in the context of alkali-solubility control during development, the heat resistance of a cured pattern, the dry etching resistance of a cured pattern, and the post-dry-etching removability of a cured pattern.

[Chem. 1]

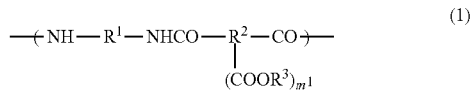

In the general formula (1), $R^1$ represents a $C_2$-$C_{50}$ bivalent organic group. $R^2$ represents a $C_2$-$C_{50}$ trivalent or tetravalent organic group. $R^3$ represents a hydrogen atom or a $C_1$-$C_{10}$ organic group. $m^1$ is an integer of 1 or 2.

The content of the structural units of the general formula (1) is 80% by mass or more, preferably 90% by mass or more, of the alkali-soluble resin.

(Diamine Residue)

In the general formula (1), $R^1$ is a diamine residue. This is preferably a diamine residue having a hydroxyl group in the context of solubility into an alkaline aqueous solution serving as a developing solution and of photosensitive performance.

Examples of raw materials which can afford diamine residues having a hydroxyl group include bis(3-amino-4-hydroxyphenyl)hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl, bis(3-amino-4-hydroxyphenyl)fluorene, bis(4-amino-3-hydroxyphenyl)hexafluoropropane, bis(4-amino-3-hydroxyphenyl)sulfone, bis(4-amino-3-hydroxyphenyl)propane, bis(4-amino-3-hydroxyphenyl)methylene, bis(4-amino-3-hydroxyphenyl)ether, bis(4-amino-3-hydroxy)biphenyl, and bis(4-amino-3-hydroxyphenyl)fluorene. In addition, examples of $R^1$ include the below-mentioned structures.

[Chem. 2]

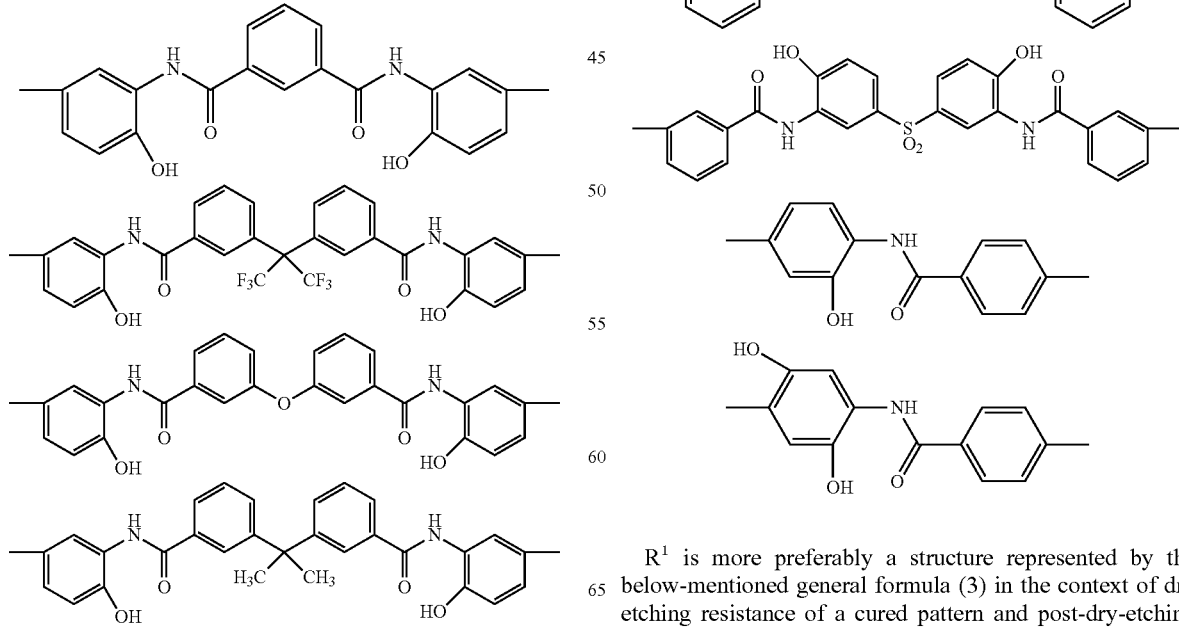

$R^1$ is more preferably a structure represented by the below-mentioned general formula (3) in the context of dry etching resistance of a cured pattern and post-dry-etching removability of a cured pattern.

[Chem. 3]

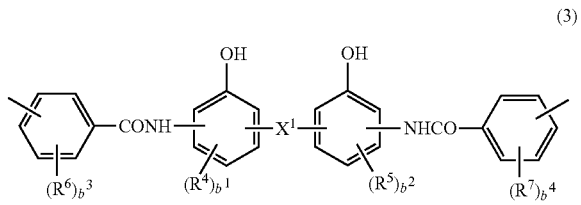

(3)

In the general formula (3), $R^4$ to $R^7$ independently represent a halogen atom or a $C_1$-$C_3$ monovalent organic group. $X^1$ is a single bond, O, S, NH, SO—$_2$, CO, a $C_1$-$C_3$ bivalent organic group, or a bivalent group which is two or more thereof bound together. In the bivalent group, the two or more moieties bound together may be the same or different. Examples of organic groups which are each the two or more moieties bound together include the following. That is, —CONH— (amide bond), —COO—, —OC(=O)O— (carbonate bond), —SS—, —S(=O)$_2$O—, and —OC(=O)CH$_2$CH$_2$C(=O)O—. $b^1$ and $b^2$ are integers of 0 to 3, and $b^3$ and $b^4$ are integers of 0 to 4.

Specific most preferable examples of diamine residues include those having the following structure.

[Chem. 4]

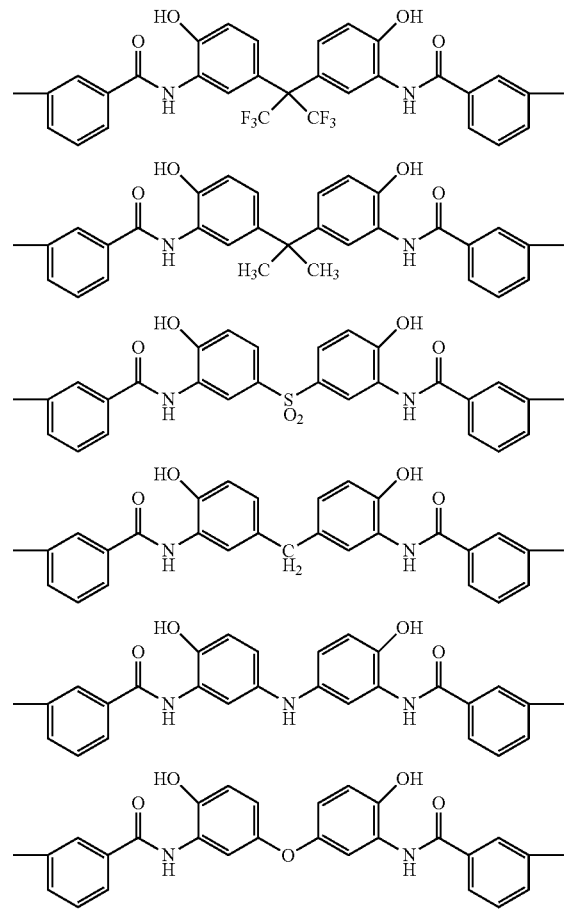

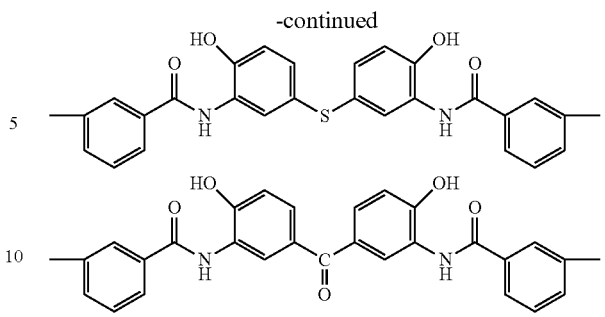

Alternatively, diamine residues may contain a structure having no hydroxyl group. Examples of diamine components used as raw materials that give such diamine residues include, but are not limited to: carboxyl-group-containing diamines such as 3,5-diaminobenzoic acid and 3-carboxy-4,4'-diaminodiphenyl ether; sulfonic-acid-containing diamines such as 3-sulfonic acid-4,4'-diaminodiphenyl ether; 3,4'-diaminodiphenyl ether, 4,4'-diaminodiphenyl ether, 3,3'-diaminodiphenyl ether, 3,4'-diaminodiphenylmethane, 4,4'-diaminodiphenylmethane, 3,3'-diaminodiphenylmethane, 3,4'-diaminodiphenylsulfone, 4,4'-diaminodiphenylsulfone, 3,3'-diaminodiphenylsulfone, 3,4'-diaminodiphenyl sulfide, 4,4'-diaminodiphenyl sulfide, 3,3'-diaminodiphenyl sulfide, 1,4-bis(4-aminophenoxy)benzene, m-phenylenediamine, p-phenylenediamine, 1,5-naphthalenediamine, 2,6-naphthalenediamine, bis[4-(4-aminophenoxy)phenyl]sulfone, bis[4-(3-aminophenoxy)phenyl]sulfone, 4,4'-bis(4-aminophenoxy)biphenyl, bis[4-(4-aminophenoxy)phenyl]ether, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',5,5'-tetramethyl-4,4'-diaminobiphenyl, 2,2'-di(trifluoromethyl)-4,4'-diaminobiphenyl; these compounds in which part of the hydrogen atoms of their aromatic ring is/are substituted with an alkyl group or a halogen atom; aliphatic diamines such as cyclohexyldiamine and methylene bis(cyclohexylamine); and the like.

In addition, as the above-exemplified diamine components used as raw materials that give the diamine residues having no hydroxyl group, those in which one to four hydrogen atoms are each substituted with a $C_1$-$C_{10}$ alkyl group such as a methyl group or an ethyl group, a $C_1$-$C_{10}$ fluoroalkyl group such as a trifluoromethyl group, a hydroxyl group, an amino group, a sulfonic group, an amide sulfonate group, a sulfonate group, or a halogen atom such as F, Cl, Br, or I may be used.

As raw materials that give these diamine residues, not only diamines but also diisocyanate compounds in which an isocyanate group in place of an amino group is bound to the structure of a diamine residue, or tetratrimethylsilylated diamines in which two hydrogen atoms of the amino group of a diamine are substituted with trimethylsilyl groups can be used.

(Acid Residue)

In the general formula (1), $R^2$ is a carboxylic acid residue and is a functional group that can be obtained from a tri-carboxylic acid compound or a tetra-carboxylic acid compound. Hereinafter, the carboxylic acid residue will simply be referred to as an "acid residue". In the context of the heat resistance of a cured pattern and the dry etching resistance of a cured pattern, acid residues containing an aromatic ring and/or an aliphatic ring are preferable, and structures represented by the following general formulae (5) to (7) are more preferable.

[Chem. 5]

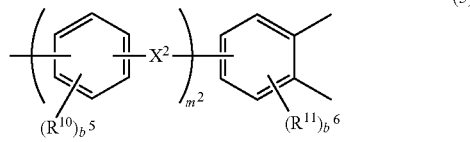
(5)

[Chem. 6]

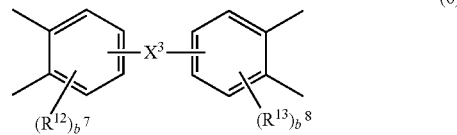
(6)

[Chem. 7]

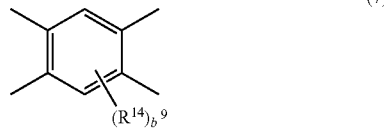
(7)

In the general formulae (5) to (7), $R^{10}$ to $R^{14}$ independently represent a halogen atom or a $C_1$-$C_3$ monovalent organic group. $X^2$ and $X^3$ are independently selected from the group consisting of a single bond, O, S, NH, SO—$_2$, CO, $C_1$-$C_3$ bivalent organic groups, and bivalent groups which are each two or more thereof bound together. In the organic group, the two or more moieties bound together may be the same or different. Examples of organic groups which are each the two or more moieties bound together include the following. That is, —CONH— (amide bond), —COO—, —OC(=O)O— (carbonate bond), —SS—, —S(=O)$_2$O—, and —OC(=O)CH$_2$CH$_2$C(=O)O—. $b^5$ is an integer of 0 to 4, and $b^6$ to $b^8$ are independently an integer of 0 to 3, and $b^9$ is an integer of 0 to 2. $m^2$ is an integer of 0 or 1.

Examples of preferable tricarboxylic acids that give acid residues include trimellitic acid, trimesic acid, diphenyl ether tricarboxylic acid, biphenyltricarboxylic acid, and the like.

Examples of preferable tetracarboxylic acids that give acid residues include: aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid; aliphatic tetracarboxylic acids such as cyclobutanetetracarboxylic acid, 1,2,3,4-cyclopentanetetracarboxylic acid, cyclohexanetetracarboxylic acid, bicyclo [2.2.1.]heptanetetracarboxylic acid, bicyclo[3.3.1.]tetracarboxylic acid, bicyclo[3.1.1.]hepto-2-enetetracarboxylic acid, bicyclo[2.2.2.]octanetetracarboxylic acid, and adamantanetetracarboxylic acid; and the like. These acids can be used singly or in combination of two or more kinds thereof.

In addition, those in which one to four hydrogen atoms of an acid residue derived from the above-exemplified tricarboxylic acid or tetracarboxylic acid are each substituted with a hydroxyl group, an amino group, a sulfonic group, an amide sulfonate group, or a sulfonate ester group may be used.

Further, if necessary, tri-carboxylic acids or tetra-carboxylic acids having a siloxane bond, such as 1-(p-carboxyphenyl)3-phthalic acid-1,1,3,3-tetramethyldisiloxane or 1,3-bisphthalic acid-1,1,3,3-tetramethyldisiloxane, can be used as acid components that give acid residues. Containing an acid residue having a siloxane bond can enhance adhesiveness to the substrate. Further, it can enhance dry etching resistance, and accordingly can keep the etching rate of a cured pattern low.

(End Capping Agent)

The (A) component according to the present invention preferably has the end of the resin capped with an end capping agent such as an acid anhydride, a monocarboxylic acid compound, an acid chloride compound, or a monoamine compound. By capping the end of the resin, dissolution rates of the resin to an alkali aqueous solution can be adjusted to a preferable range.

Examples of such acid anhydride compounds include dicarboxylic acid anhydrides such as phthalic anhydride, maleic anhydride, nadic anhydride, cyclohexane dicarboxylic acid anhydride, and 3-hydroxy phthalic anhydride.

Examples of monocarboxylic acid compounds include 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, and the like.

Examples of acid chlorides include: monoacid chloride compounds resulting from the acid-chloridization of the carboxyl group of the above-mentioned monocarboxylic acid compounds; and monoacid chloride compounds resulting from the acid-chloridization of only one of the carboxyl groups of a dicarboxylic acid, examples of the dicarboxylic acids including terephthalic acid, phthalic, maleic acid, cyclohexane dicarboxylic acid, 3-hydroxy phthalic, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, 2,7-dicarboxynaphthalene, and the like. In addition, active ester compounds obtained through reaction between such a monoacid chloride compound and N-hydroxybenzotriazole or N-hydroxy-5-norbornene-2,3-dicarboxyimide can be used.

Examples of monoamine compounds include aniline, naphthylamine, aminopyridine, 3-ethynylaniline, 4-ethynylaniline, 3-amino-4,6-dihydroxypyrimidine, 2-aminophenol, 3-aminophenol, 4-aminophenol, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxy naphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxy naphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-o-toluic acid, ameride, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, and the like.

These end capping agents such as acid anhydrides, monocarboxylic acid compounds, acid chloride compounds, and monoamine compounds can be used singly or in combination of two or more kinds thereof and may be used together with another end capping agent.

The content of the above-mentioned end capping agent such as an acid anhydride, a monocarboxylic acid compound, an acid chloride compound, or a monoamine compound is preferably in a range of 0.1 to 60% by mole with respect to the number of moles of charged component monomers which constitute carboxylic acid residues and amine residues, more preferably 5 to 50% by mole. Such a range can afford a photosensitive resin composition a solution of which has a suitable viscosity when the photosensitive resin composition is applied, and which has excellent film properties.

The (A) alkali-soluble resin used in the present invention can be obtained by polymerization reaction of an acid type compound and an amine type compound. Examples of acid type compounds include dicarboxylic acids, tricarboxylic acids, tetracarboxylic acids, anhydrides, acid chlorides, active esters, active amides, and the like. Examples of amine type compounds include: diamines; diisocyanate compounds in which an amino group of a diamine compound is substituted with an isocyanate group; and tetratrimethylsilylated diamines in which two hydrogen atoms of the amino group of a diamine are substituted with trimethylsilyl groups.

In addition, a resin used in the present invention is preferably obtained by polymerization followed by precipitation in a poor solvent for the resin, such as methanol or water, and then washing and drying. The precipitation enables the removal of an esterifying agent and a condensing agent which are used for polymerization, a by-product attributable to an acid chloride, a low molecular weight component of the resin precursor, and the like, and accordingly has the advantage of enhancing the heat resistance of the cured pattern.

<(B) Photoacid Generator>

The resin composition according to the present invention contains a photoacid generator (B). Containing a photoacid generator enables the formation of a positive pattern in which the exposed portion is removed with an alkali aqueous solution serving as a developing solution.

Photoacid generators are compounds that generate acid under light irradiation. Such a compound is not limited to a particular one, and is preferably a compound having a naphthoquinone diazide sulfonic acid ester-bound to a compound having a plurality of phenolic hydroxyl groups. Further, naphthoquinone diazide compounds in which 50% by mole or more of all phenolic hydroxyl groups is ester-bound to naphthoquinone diazide sulfonic acid are preferably used. Using such a naphthoquinone diazide compound can afford a positive photosensitive resin composition that is photosensitive to the i-line (365 nm), h-line (405 nm), or g-line (436 nm) light, which are general ultraviolet rays, and achieves a contrast in the solubility to an alkali aqueous solution between the exposed portion and the unexposed portion.

In the present invention, either compounds having a 5-naphthoquinone diazide sulfonyl group or compounds having a 4-naphthoquinone diazide sulfonyl group can be preferably used as naphthoquinone diazide compounds, and also those which have a 4-naphthoquinone diazide sulfonyl group and a 5-naphthoquinone diazide sulfonyl group in the same molecule can be used. In addition, 4-naphthoquinone diazide sulfonyl ester compounds and 5-naphthoquinone diazide sulfonyl ester compounds can be used together.

In this regard, these naphthoquinone diazide compounds can be synthesized by known esterification reactions between a compound having a phenolic hydroxyl group and a naphthoquinone diazide sulfonic acid chloride.

Specific examples of compounds having a phenolic hydroxyl group include the following compounds. These are available from Honshu Chemical Industry Co., Ltd.

[Chem. 8]

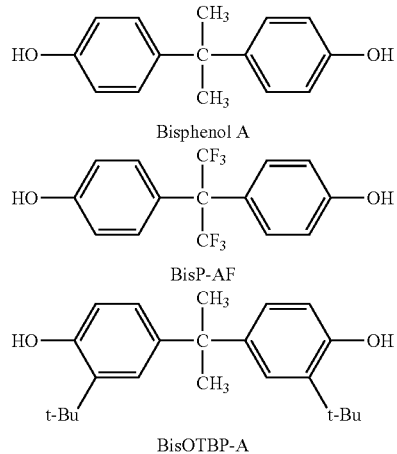

-continued
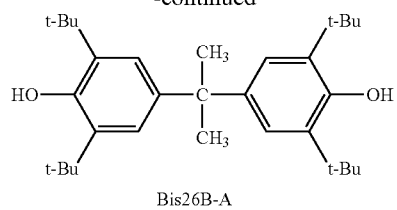
Bis26B-A
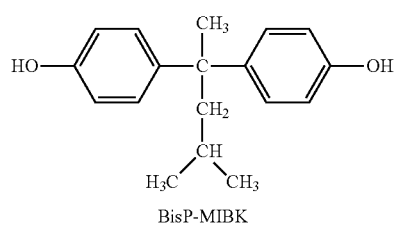
BisP-MIBK
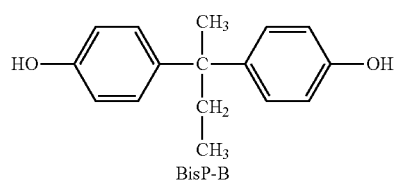
BisP-B
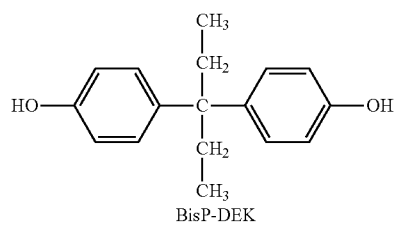
BisP-DEK
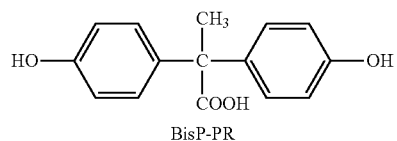
BisP-PR
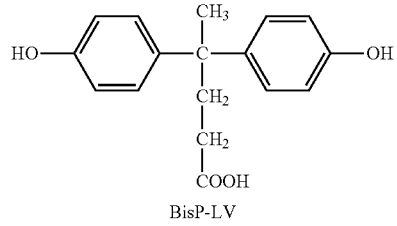
BisP-LV
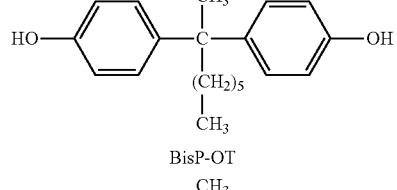
BisP-OT
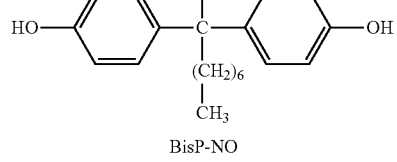
BisP-NO
-continued
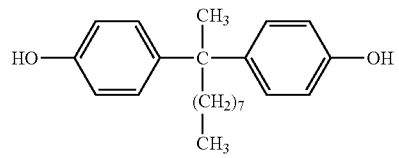
BisP-DE
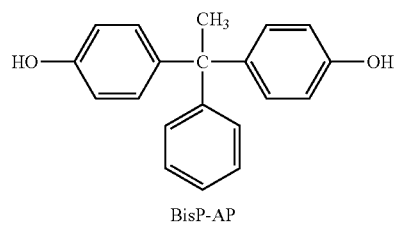
BisP-AP
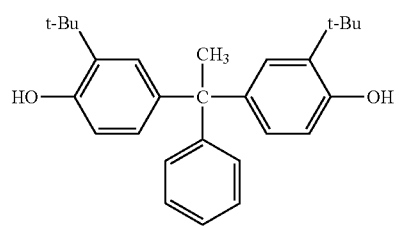
BisOTBP-AP
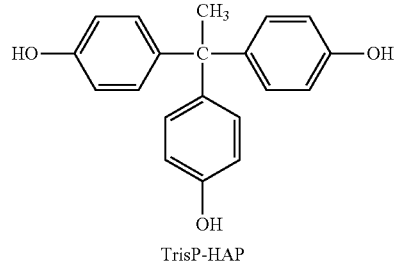
TrisP-HAP
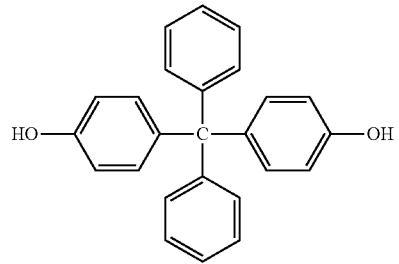
BisP-DP
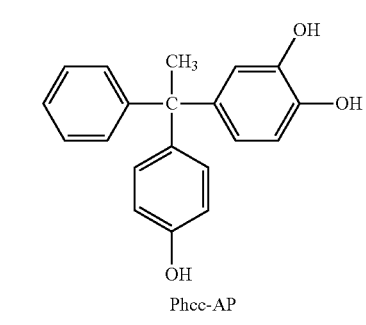
Phcc-AP

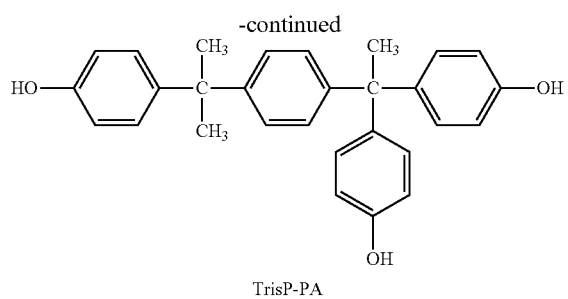

TrisP-PA

[Chem. 9]

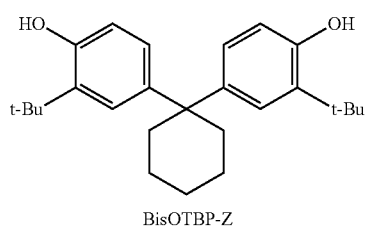

BisOTBP-Z

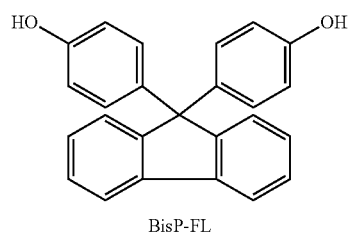

BisP-FL

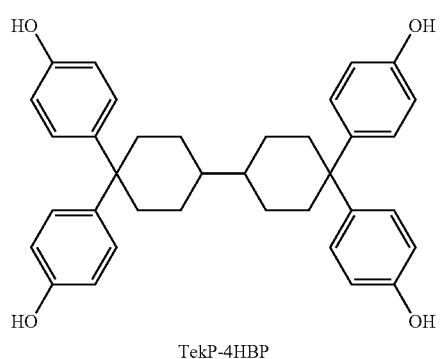

TekP-4HBP

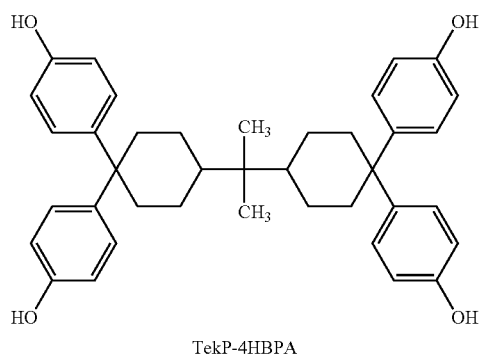

TekP-4HBPA

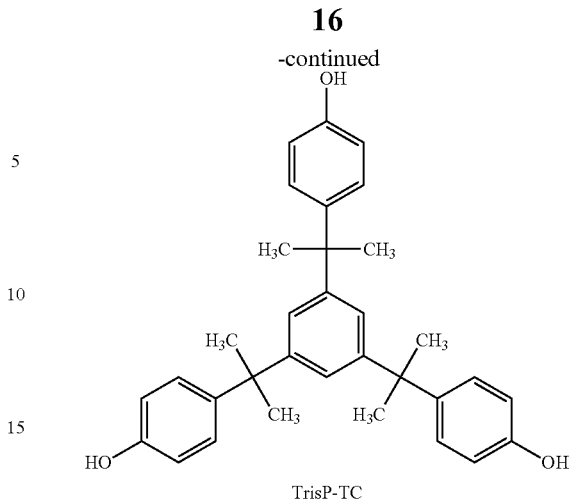

TrisP-TC

The content of a photoacid generator is not limited to a particular one, and is preferably 2 to 60 parts by mass, further preferably 4 to 50 parts by mass, with respect to 100 parts by mass of the (A) component resin. Such a range achieves a better solubility contrast between the exposed portion and the unexposed portion. In addition, such a range allows a solution of the resin composition to have a suitable viscosity when applied, and can afford a cured film having excellent film properties.

In addition, the resin composition according to the present invention can contain, as a dissolution promoter apart from a naphthoquinone diazide compound, such a compound having a phenolic hydroxyl group as in the above-mentioned specific examples without esterifying the compound with a naphthoquinone diazide sulfonyl group. Containing such a dissolution promoter allows the obtained resin composition to have solubility enhanced to an alkali aqueous solution in the exposed portion. In addition, a naphthoquinone diazide compound and a dissolution promoter cause hydrogen bonding in the unexposed portion and thus can suppress solubility to an alkali aqueous solution. Thus, an attempt can be made to enhance a contrast in solubility between the exposed portion and the unexposed portion.

The content of a dissolution promoter is preferably 1 to 40 parts by mass, more preferably 3 to 30 parts by mass, with respect to 100 parts by mass of the (A) component resin. In this regard, two or more dissolution promoters may be contained, and the total amount of two or more thereof contained is preferably in the above-mentioned ranges.

<(C) Epoxy Compound or Oxetane Compound>

The positive photosensitive resin composition according to the present invention contains at least one compound (C) selected from the group consisting of epoxy compounds and oxetane compounds. Containing at least one selected from the group consisting of epoxy compounds and oxetane compounds allows the resin to afford a desired resist shape through thermal flowability control and curing.

Examples of epoxy compounds include those of glycidyl ether types, glycidyl amine types, and olefin oxidation types. The first two types can be obtained by reaction between epichlorohydrin and a compound having active hydrogen. Specific examples of these epoxy compounds include, without particular limitation, bisphenol A type epoxies, bisphenol F type epoxies, hydrogenated bisphenol A type epoxies, hydrogenated bisphenol F type epoxies, bisphenol S type epoxies, brominated bisphenol A type epoxies, biphenyl type epoxies, naphthalene type epoxies, fluorene type epoxies, spiro ring type epoxies, bisphenol alkane epoxies, phenol novolac type epoxies, ortho-cresol novolac type epoxies, brominated cresol novolac type epoxies, trishydroxymethane type epoxies, tetraphenylolethane type epoxies, alicyclic type epoxies, alcohol type epoxies, and the like.

Examples of commercially available epoxy compounds include, but are not limited to: YDB-340 (tradename (similarly hereinafter)), YDB-412, YDF-2001, and YDF-2004 made by Tohto Kasei Co., Ltd.; NC-3000-11, EPPN-501H, EOCN-1020, NC-7000L, EPPN-201L, XD-1000, and EOCN-4600 made by Nippon Kayaku Co., Ltd.; DENACOL EX-203, DENACOL EX-251, and DENACOL EX-711 made by Nagase ChemteX Corporation; EPIKOTE 1001, EPIKOTE 1007, EPIKOTE 1009, EPIKOTE 5050, EPIKOTE 5051, EPIKOTE 1031S, EPIKOTE 180S65, EPIKOTE 157H70, and YX-315-75 made by Japan Epoxy Resin Co., Ltd.; EHPE3150, PLACCEL G402, PUE101, and PUE105 made by Daicel Corporation; and the like. These may also be used singly or in combination of two or more thereof.

Specific examples of oxetane compounds include, but are not limited to, 1,4-bis{[(3-ethyloxetane-3-yl)methoxy]methyl}benzene, 3,3'-[4,4'-oxybis(methylene)bis(4,1-phenylene)bis(methylene)]bis(oxy)bis(methylene)bis(3-ethyloxetane), 1,4-bis {(4-{[(3-ethyloxetane-3-yl)methoxy]methyl}benzyloxy)methyl}benzene, 3-ethyl-3-{[3-(ethyloxetane-3-yl)methoxy]methyl}oxetane, bis[1-ethyl(3-oxetanyl)]methyl ether, 4,4'-bis[(3-ethyl-3-oxetanyl)methoxymethyl]biphenyl, 4,4'-bis(3-ethyl-3-oxetanylmethoxy)biphenyl, ethylene glycol bis(3-ethyl-3-oxetanylmethyl)ether, diethylene glycol bis(3-ethyl-3-oxetanylmethyl)ether, bis(3-ethyl-3-oxetanylmethyl) diphenoate, trimethylolpropane tris(3-ethyl-3-oxetanylmethyl)ether, pentaerythritol tetrakis(3-ethyl-3-oxetanylmethyl)ether, poly[[3-[(3-ethyl-3-oxetanyl)methoxy]propyl]silasesquioxane] derivative, oxetanyl silicate, phenol novolac type oxetane, 1,3-bis[(3-ethyloxetane-3-yl)methoxy]benzene, and the like. These may also be used singly or in combination of two or more thereof.

The below-mentioned oxetane compounds (10) and (11) are more preferable in the context of a curved surface cured pattern, dry etching resistance of a cured pattern, and post-dry-etching removability of a cured pattern.

[Chem. 10]

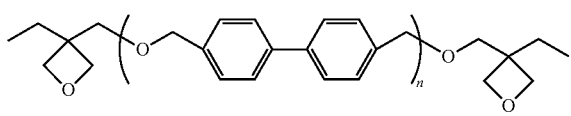

(10)

n represents an integer of 1 to 10.

[Chem. 11]

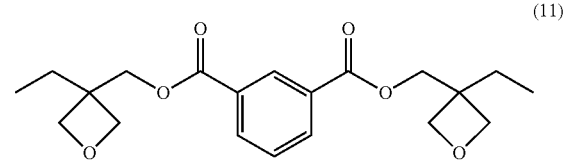

(11)

The oxetane compound (11) is most preferable in the context of post-dry-etching removability of a cured pattern.

The content of at least one compound (C) selected from the group consisting of epoxy compounds and oxetane compounds is preferably 1 to 100 parts by mass, more preferably 2 to 80 parts by mass, with respect to 100 parts by mass of the above-mentioned alkali-soluble resin (A)

<(D) Silane Compound of Hydrolytic Condensate Thereof>

The resin composition according to the present invention preferably contains a silane compound represented by the general formula (12) or a hydrolytic condensate thereof.

[Chem. 12]

(12)

In the general formula (12), $R^8$ represents a $C_9$-$C_{18}$ fused polycyclic aromatic hydrocarbon group, and a hydrogen atom(s) of the fused polycyclic aromatic hydrocarbon group may be substituted with a hydroxy group(s), an alkyl group(s), an alkenyl group(s), or an alkoxy group(s). $R^9$ represents a $C_1$-$C_6$ alkyl group. s represents an integer of 1 to 3.

The silane compound represented by the general formula (12) or a hydrolytic condensate thereof can enhance adhesiveness between the coating film pattern of the resin composition and a base material because the silanol group or the alkoxy silyl group is adsorbed to the substrate surface through hydrogen bonding. In addition, aromatic rings hydrophobize the substrate surface, and thus can suppress the permeation of a developing solution into the underside of the pattern during development. This can suppress the exfoliation of the pattern during development.

Furthermore, the effect of fused polycyclic aromatic hydrocarbon groups can further enhance dry etching resistance of a cured pattern.

Examples of silane compounds represented by the general formula (12) include, but are not limited to, 1-naphthyltrimethoxysilane, 1-naphthyltriethoxysilane, 1-naphthyltri-n-propoxysilane, di(1-naphthyl)dimethoxysilane, di(1-naphthyl)diethoxysilane, di(1-naphthyl)din-propoxysilane, tri(1-naphthyl)methoxysilane, tri(1-naphthyl)ethoxysilane, tri(1-naphthyl)-n-propoxysilane, 2-naphthyltrimethoxysilane, 2-naphthyltriethoxysilane, 2-naphthyltri-n-propoxysilane, di(2-naphthyl)dimethoxysilane, di(2-naphthyl)diethoxysilane, di(2-naphthyl)din-propoxysilane, tri(2-naphthyl)methoxysilane, tri(2-naphthyl)ethoxysilane, tri(2-naphthyl)-n-propoxysilane, 1-anthracenyltrimethoxysilane, 9-anthracenyltrimethoxysilane, 9-phenanthrenyltrimethoxysilane, 9-fluorenyltrimethoxysilane, 2-fluorenyltrimethoxysilane, 2-fluorenoneyltrimethoxysilane, 1-pyrenyltrimethoxysilane, 2-indenyltrimethoxysilane, 5-acenaphthenyltrimethoxysilane, and the like. In addition, these exemplified silane compounds represented by the general formula (12) whose hydrogen atoms on their aromatic ring are substituted with any of a hydroxyl group, a $C_1$-$C_6$ alkyl group, an alkenyl group, and an alkoxy group can be used.

These compounds represented by the general formula (12) and hydrolytic condensates thereof may be used singly or in combination of two or more kinds thereof.

The content of the (D) silane compound or a hydrolytic condensate thereof is preferably 0.1 to 80 parts by mass, more preferably 0.5 to 50 parts by mass, with respect to 100 parts by mass of the alkali-soluble resin (A). Such a range allows a solution of the photosensitive resin composition to have a suitable viscosity when applied, and can afford a cured film having excellent film properties.

<Other Components>

The resin composition according to the present invention may contain a silane coupling agent other than the (D) component, if necessary. Containing a silane coupling agent can enhance adhesiveness to the base material during the formation of a cured film.

Preferable silane coupling agents are those whose organic group and hydrolytic group are bound to a silicon atom, and preferable hydrolytic groups are alkoxy groups. Specific examples of such compounds include, but are not limited to; silane coupling agents such as vinyltrimethoxysilane, vinyltriethoxysilane, 2-(3,4-epoxycyclohexyl)ethyltrimethoxysilane, 3-glycidoxypropyltrimethoxysilane, 3-glycidoxypropyltriethoxysilane, p-styryltrimethoxysilane, 3-aminopropyltrimethoxysilane, 3-aminopropyltriethoxysilane, n-phenyl-3-aminopropyltrimethoxysilane, 3-mercaptopropylmethyldimethoxysilane, 3-mercaptopropyltrimethoxysilane, 3-isocyanate propyltriethoxysilane, 4-hydroxyphenyltrimethoxysilane, 4-methoxyphenyltrimethoxysilane, 4-ethoxyphenyltrimethoxysilane; and the like. The resin composition may contain two or more kinds thereof.

The content of a silane coupling agent other than the (D) component is preferably 0.1 to 10 parts by mass with respect to 100 parts by mass of the alkali-soluble resin (A).

The resin composition according to the present invention may be dissolved or dispersed in a solvent so that a coating film can be formed on a substrate. Examples of solvents include, but are not limited to: polar aprotic solvents such as N-methyl-2-pyrrolidone, γ-butyrolactone, N,N-dimethylformamide, N,N-dimethylacetamide, and dimethyl sulfoxide; ethers such as tetrahydrofuran, dioxane, and propylene glycol monomethyl ether; ketones such as acetone, methylethylketone, diisobutylketone, and diacetone alcohol; esters such as ethyl acetate, propylene glycol monomethyl ether acetate, and ethyl lactate; aromatic hydrocarbons such as toluene and xylene; and the like. The resin composition may contain two or more kinds thereof.

The content of the solvent is preferably 50 parts by mass or more, more preferably 100 parts by mass or more, and preferably 2000 parts by mass or less, more preferably 1500 parts by mass or less, with respect to 100 parts by mass of the alkali-soluble resin (A). The resin composition is formed into a coating film by applying a solution or dispersion of the resin composition to a substrate followed by heating and drying.

The resin composition according to the present invention may contain a surfactant. Containing a surfactant can suppress coating unevenness and afford a uniform coating film. Fluorine-based surfactants and silicone-based surfactants are preferably used.

Specific examples of fluorine-based surfactants include fluorine-based surfactants containing a compound having a fluoroalkyl or fluoroalkylene group at at least one site of the end, main-chain, and side chain of 1,1,2,2-tetrafluorooctyl (1,1,2,2-tetrafluoropropyether, 1,1,2,2-tetrafluorooctylhexyl ether, octaethylene glycol di(1,1,2,2-tetra fluoro butyl) ether, hexaethylene glycol(1,1,2,2,3,3-hexafluoropentyl) ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-[3-(perfluorooctanesulfoneamide)propyl]-N,N'-dimethyl-N-carboxymethylene ammonium betaine, perfluoroalkylsulfoneamidepropyltrimethyl ammonium salt, perfluoroalkyl-N-ethylsulfonylglycine salt, phosphoric acid bis(N-perfluorooctylsulfonyl-N-ethylaminoethyl), monoperfluoroalkylethylphosphoric acid ester, or the like. In addition, examples of commercially available fluorine-based surfactants include fluorine-based surfactants such as: "MEGAFAC" (registered trademark) F142D, MEGAFAC F172, MEGAFAC F173, MEGAFAC F183, MEGAFAC F444, and F477 (which are made by DIC Corporation); EFTOP EF301, EFTOP 303, and EFTOP 352 (made by Shin Akita Chemical Co., Ltd.); FLUORAD FC-430 and FLUORAD FC-431 (made by Sumitomo 3M Limited); "ASAHIGUARD" (registered trademark) AG710, "SURFLON" (registered trademark) S-382, SURFLON SC-101, SURFLON SC-102, SURFLON SC-103, SURFLON SC-104, SURFLON SC-105, and SURFLON SC-106 (made by Asahi Glass Co., Ltd.); BM-1000 and BM-1100 (made by Yusho Co., Ltd.); NBX-15, FTX-218, and DFX-18 (made by Neos Corporation).

Examples of commercially available silicone-based surfactants include: SH28PA, SH7PA, SH21PA, SH30PA, and ST94PA (made by Dow Corning Toray Silicone Co., Ltd.); BYK-333 (made by BYK Japan KK); and the like.

The content of a surfactant in the positive photosensitive resin composition is generally 0.0001 to 1% by mass.

The resin composition according to the present invention may contain a compound that has absorption in a wavelength region used as exposure wavelengths and that does not undergo color fading under the light. In cases where a positive acting coating film made of the resin composition according to the present invention contains such a compound, the obtained coating film always absorbs part of irradiated light during photolithography. As a result, excessive exposure and halation which are due to reflected light from a substrate can be prevented, and the resistance to developing operations for a pattern to be left and the adhesiveness of the pattern can be maintained during development.

Examples of compounds having such absorption characteristics as above-mentioned include coumarin derivatives, benzotriazole derivatives, hydroxy benzophenone derivatives, anthraquinone derivatives, acenaphthene derivatives, and the like. Examples of coumarin derivatives include COUMARIN and COUMARIN-4 (which are tradenames and made by Sigma-Aldrich Japan LLC), 4-hydroxycoumarin and 7-hydroxycoumarin (made by Tokyo Chemical Industry Co., Ltd.); examples of benzotriazole derivatives include ""SUMISORB"" (registered trademark (hereinafter similarly)) 200, "SUMISORB" 250, "SUMISORB" 320, "SUMISORB" 340, and "SUMISORB" 350 (which are tradenames and made by Sumitomo Chemical Co., Ltd.); examples of hydroxybenzophenone derivatives include "SUMISORB" 130 and "SUMISORB" 140 (which are tradenames and made by Sumitomo Chemical Co., Ltd.), "ZISLIZER" (registered trademark (hereinafter similarly)) M, "ZISLIZER" 0 (which are tradenames and made by Sankyo Kasei Co., Ltd.), and "SEESORB" (registered trademark) 103 (Shipro Kasei Kaisha, Ltd.); examples of anthraquinone derivatives include 1-hydroxyanthraquinone, 2-hydroxyanthraquinone, 3-hydroxyanthraquinone, 1-hydroxy-2-methoxyanthraquinone, 1,2-dihydroxyanthraquinone, 1,3-dihydroxyanthraquinone, 1,4-dihydroxyanthraquinone, 1,5-dihydroxyanthraquinone, 1,8-dihydroxyanthraquinone, 1,3-dihydroxy-3-methylanthraquinone, 1,5-dihydroxy-3-methylanthraquinone, 1,6-dihydroxy-3-methylanthraquinone, 1,7-dihydroxy-3-methylanthraquinone, 1,8-dihydroxy-3-methylanthraquinone, 1,8-dihydroxy-2- methylanthraquinone, 1,3-dihydroxy-2-methoxyanthraquinone, 2,4-dihydroxy-1-methoxyanthraquinone, 2,5-dihydroxy-1-methoxyanthraquinone, 2,8-dihydroxy-1-methoxyanthraquinone, 1,8-dihydroxy-3-methoxy-6-methylanthraquinone, 1,2,3-trihydroxyanthraquinone, 1,3,

[Chem. 13]

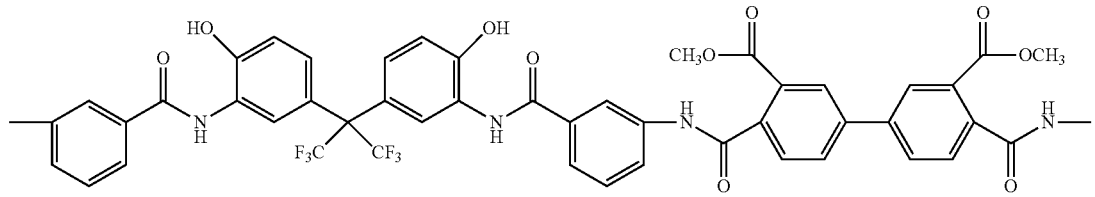

5-trihydroxyanthraquinone, 2-aminoanthraquinone, 2-amino-1-nitroanthraquinone, 2,6-diaminoanthraquinone, 1-methoxyanthraquinone, 2-methoxyanthraquinone, 1,8-dimethoxyanthraquinone, 1-acetylaminoanthraquinone, 2-acetylaminoanthraquinone, 2-tert-butylanthraquinone; examples of acenaphthene compounds include 5-nitroacenaphthene and the like.

Further, the resin composition according to the present invention can contain additives such as cross-linking agents, cross-linking promoters, sensitizing agents, thermal radical generators, dissolution promoters, solubility suppressing agents, stabilizers, and antifoaming agents, if necessary.

<Cured Pattern>

In applications for substrates obtained according to the present invention, a pattern of a film of the resin composition needs both dry etching resistance and post-dry-etching removability. For these purposes, the pattern is preferably cured.

The composition of a cured pattern resulting from this step contains an amide group and an imide group, and the molar ratio of the amide group to the imide group (imide group ratio) is preferably as follows: 0.3≤imide group/(amide group+imide group)≤0.7. A more preferable one is 0.4≤imide group/(amide group+imide group)≤0.6.

Selecting the type of the (A) alkali-soluble resin so that the imide group ratio can be in such a range affords excellent heat resistance, curvature, etching resistance, and removability to the pattern.

This imide group ratio can be adjusted by using, as the (A) alkali-soluble resin, a polyimide precursor having a structural unit represented by the general formula (1) as the main component and using a high temperature as polymerization temperature in polymerization for obtaining the ratio. In this case, a preferable polymerization temperature is 80° C. to 250° C., more preferably 100° C. to 200° C.

In addition, the desired imide group ratio can be adjusted to a desired one on the basis of the conditions under which to heat-cure a relief pattern which has been obtained with the resin composition containing a polyimide precursor having a structural unit represented by the general formula (1) as the main component. In this case, a preferable heat-curing temperature is 180° C. to 250° C., more preferably 200 to 230° C. In addition, an oxygen concentration in heat-curing is preferably 5% by volume or less.

In addition, the ratio can be adjusted to a desired one on the basis of combinations of the conditions for polymerization and heat-curing.

The imide group ratio is calculated in the following manner. In the structural unit, the number of amide groups contributing to imidization reaction is assumed to be A1, the number of amide groups not contributing to imidization reaction to be A2, and the ratio of A1 converted to imide groups to be B.

For example, in the case of the following structural unit, A1 and A2 result in A1=2 and A2=2 respectively.

In the case of the following structural unit, A1 and A2 result in A1=2 and A2=0 respectively.

[Chem. 14]

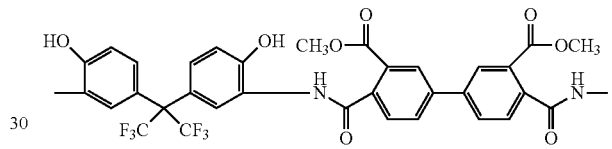

B is calculated using the following method, and the imide group ratio, (A1×B)/(A1+A2), is calculated. The cured pattern is measured for infrared absorption spectrum, and an absorbance B1 of a peak assigned to the C—N stretching vibration of around 1377 cm$^{-1}$ of the imide structure is determined Next, the pattern is heat-treated in a nitrogen atmosphere at 350° C. for one hour to promote 100% imidization, the infrared absorption spectrum is measured, and the absorbance B2 of the same peak is measured. B is determined as B1/B2.

<Method of Producing Pattern of Coating Film>

A method of producing a pattern of a coating film using the resin composition according to the present invention will be described.

First, the resin composition according to the present invention including a solvent is applied to a substrate by a known method such as a spin coating method or a slit coating method.

Examples of substrates to be used include, but are not limited to: substrates containing at least one element selected from the group consisting of aluminum, silicon, titanium, tantalum, gallium, germanium, iron, nickel, zinc, indium, boron, manganese, phosphorus, cobalt, and zirconium; substrates with any of these formed on the surface to be coated; and the like. Among these, a substrate selected from the group consisting of sapphire ($Al_2O_3$), silicon (Si), silicon oxide ($SiO_2$), silicon nitride (SiN), gallium nitride (GaN), silicon carbide (SiC), gallium arsenide (GaAs), indium phosphide (InP), aluminum nitride (AlN), tantalum nitride (TaN), lithium tantalate ($LiTaO_3$), boron nitride (BN), titanium nitride (TiN), and barium titanate ($BaTiO_3$) is preferable.

Examples of coating methods include spin coating using a spinner, spray coating, roll coating, and the like. In addition, the coating film thickness varies depending on the coating method, the solid content of the composition, the viscosity, and the like, but usually the thickness of a dried film is preferably 0.1 to 150 μm.

The substrate can be pre-treated with the above-mentioned silane coupling agent so that the adhesiveness between a substrate such as a silicon wafer and the resin composition can be enhanced. For example, surface treatment is carried out by spin coating, immersion, spray coating, steaming, and the like using a solution of, for example, 0.5 to 20% by mass of a silane coupling agent dissolved in a solvent such as isopropanol, ethanol, methanol, water, tetrahydrofuran, propylene glycol monomethyl ether acetate, propylene glycol monomethyl ether, ethyl lactate, and diethyl adipate. After that, heat-treatment is optionally carried out at 50° C. to 300° C. to advance the reaction between the substrate and the silane coupling agent.

Next, the resin composition applied to the substrate is dried to obtain a coating film of the resin composition. The drying method is preferably heating. An oven, a hot plate, infrared ray, or the like is used preferably in a range of 50° C. to 150° C. for one minute to several hours.

Next, this resin composition coating film is irradiated with actinic-rays in accordance with a desired pattern. This step is an exposure step. Examples of actinic-rays used for exposure include ultraviolet rays, visible rays, electron rays, X-rays, and the like; ultraviolet rays having a wavelength of 350 nm to 450 nm are preferable in the present invention; and the i-line (365 nm wavelength), h-line (405 nm wavelength), and g-line (436 nm wavelength) of the mercury lamp are preferably used.

After exposure, development is carried out to form a pattern of the resin composition coating film. A developing solution is usually used. The exposed portion or the unexposed portion is removed by development. The removal of the exposed portion is positive acting. The removal of the unexposed portion is negative acting.

As a developing solution, an alkali developing solution is preferable, and an aqueous solution of a compound exhibiting alkalinity is preferable. Examples of such compounds include tetramethylammonium hydroxide, diethanolamine, diethylamino ethanol, sodium hydroxide, potassium hydroxide, sodium carbonate, potassium carbonate, triethylamine, diethylamine, methylamine, dimethylamine, dimethylaminoethyl acetate, dimethylamino ethanol, dimethylaminoethyl methacrylate, cyclohexylamine, ethylenediamine, hexamethylenediamine, and the like. To such an alkali aqueous solution, polar solvents such as N-methyl-2-pyrrolidone, N,N-dimethylformamide, N,N-dimethylacetamide, dimethyl sulfoxide, γ-butyrolactone, and dimethylacrylamide; alcohols such as methanol, ethanol, and isopropanol; esters such as ethyl lactate and propylene glycol monomethyl ether acetate; ketones such as cyclopentanone, cyclohexanone, isobutyl ketone, and methylisobutyl ketone; and the like may be added singly or in combination of two or more kinds thereof, depending on the case.

After development, the coating film is preferably rinsed with water. Also here, alcohols such as ethanol and isopropyl alcohol; esters such as ethyl lactate and propylene glycol monomethyl ether acetate; and the like may be added to water for rinsing.

Then, curing the obtained pattern of the resin composition coating film can afford a cured pattern. For curing, a heating operation is preferable. For example, a cured pattern is formed by curing with a heating device such as a hot plate or an oven in a range of 150 to 450° C. for about 30 seconds to about two hours. It is preferably 180° C. to 250° C., more preferably 200 to 230° C. This is also preferably under an atmosphere having an oxygen concentration of 5% by volume or less.

The cross-sectional shape of the cured pattern needs to have a curved outline, not a rectangular one, and is particularly preferably semicircular. The semicircular shape allows light scattering to increase, and can enhance the efficiency of taking out light from the light emitting element.

The semicircular shape as mentioned here means a shape formed by a convex bulging curve such that the height of the pattern in cross-section shape is equal to or shorter than the length of the pattern base. The FIGURE shows an example of the pattern 2 formed on the substrate 1 and having a substantially semicircular cross-sectional shape.

<Method of Producing Convexo-Concave Substrate>

A desired convexo-concave pattern can be provided on a substrate by etching treatment using, as a resist mask, a pattern formed from the resin composition according to the present invention. The pattern is preferably a cured one.

Examples of etching methods include wet etching, dry etching, and the like, and dry etching is preferable in the context of the uniformity in the surface of a pattern formed on a substrate.

For dry etching treatment, $BCl_3$, $Cl_2$, $CF_4$, $CHF_3$, $C_6F_8$, $SbF_6$, $O_2$, Ar, and the like can be used, and $BCl_3$ and $Cl_2$ are preferably used.

In addition, temperatures for etching are preferably 80° C. to 400° C., more preferably 90° C. to 300° C., most preferably 100° C. to 250° C., in order to increase the etching speed for a substrate.

The pattern formed from the resin composition according to the present invention and the pattern treated by dry etching undergo removal using a resist removing liquid after the etching. The removing method is preferably carried out by immersion in a resist removing liquid at normal temperature to 100° C. for 5 seconds to 24 hours using a method such as showering, dipping, or paddling.

As resist removing liquids, known resist removing liquids can be used, and specific examples thereof include; Removing Liquid 104, Removing Liquid 105, Removing Liquid 106, and SST-3 (which are tradenames and made by Tokyo Ohka Kogyo Co., Ltd.); EKC-265, EKC-270, and EKC-270T (which are tradenames and made by DuPont K.K.); N-300 and N-321 (which are tradenames and made by Nagase ChemteX Corporation); and the like.

In addition, the substrate is preferably rinsed with water or an organic solvent after the removal of the resin composition, and, if necessary, can be dried and baked in a range of 50 to 150° C. using a heating device such as a hot plate and an oven.

<Method of Producing Light Emitting Element>

Light emitting elements for LED can be made by forming a convexo-concave substrate using the resin composition according to the present invention; forming, on the convexo-concave surface of the substrate, at least one layer selected from the group consisting of a buffer layer composed of GaN or AlN, an n-type GaN layer, a clad layer composed of an InGaN light emitting layer or a p-type AlGaN, and a p-type GaN contact layer; and forming electrodes thereon.

For example, a processed sapphire substrate is mounted in a Metal Organic Chemical Vapor Deposition device (MOCVD device) and subjected to thermal cleaning at a high temperature of 1000° C. or more in an atmosphere having nitrogen gas as the main component to deposit a GaN low temperature buffer layer, an n-GaN layer, an InGaN layer, a p-AlGaN layer, and a p-GaN layer in this order. After this, the n-GaN is exposed out by means of etching, and an electrode is formed on each of the n-GaN layer and the p-GaN layer. The substrate with electrodes formed thereon undergoes element separation through dicing, whereby it can be formed into an LED light emitting element.

The resin composition according to the present invention is suitably used also as a dry etching photoresist intended for exposing out the n-GaN layer.

EXAMPLES

Below, the present invention will be described further specifically with reference to Examples, but the present invention is not limited to these Examples. Here, abbreviated words are used for the below-mentioned compounds from among the compounds employed.

NMP: N-methyl-2-pyrrolidone
GBL: γ-butyrolactone

Here, each item was evaluated using the following methods.

(1) Calculation of Imide Group Ratio

In the structural unit, the number of amide groups contributing to imidization reaction is assumed to be A1, the number of amide groups not contributing to imidization reaction to be A2, and the ratio of A1 converted to imide groups to be B.

For example, in the case of the following structural unit, A1 and A2 result in A1=2 and A2=2 respectively.

[Chem. 15]

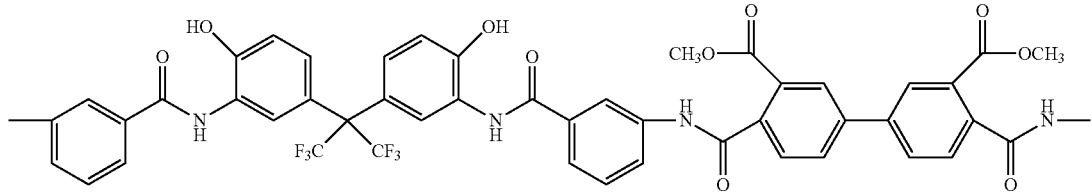

In the case of the following structural unit, A1 and A2 result in A1=2 and A2=0 respectively.

[Chem.16]

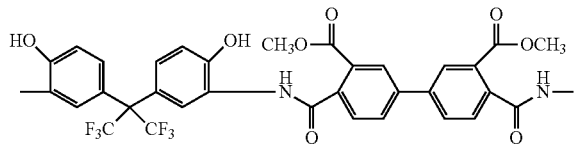

B was calculated using the following method, and the imide group ratio (A1×B)/(A1+A2) was calculated.

(1-1) Polymer

First, the synthesized polymer was measured for infrared absorption spectrum, and an absorbance B3 of a peak assigned to the C—N stretching vibration of around 1377 cm$^{-1}$ of the imide structure was determined Next, the polyimide was heat-treated in a nitrogen atmosphere at 350° C. for one hour to promote 100% imidization, the infrared absorption spectrum was measured, and the absorbance B4 of the same peak was measured. B was determined as B3/B4.

(1-2) Cured Pattern

The cured pattern was measured for infrared absorption spectrum, and an absorbance B5 of a peak assigned to the C—N stretching vibration of around 1377 cm$^{-1}$ of the imide structure was determined. Next, the pattern was heat-treated in a nitrogen atmosphere at 350° C. for one hour to promote 100% imidization, the infrared absorption spectrum was measured, and the absorbance B6 of the same peak was measured. B was determined as B5/B6.

(2) Film Thickness of Prebaked Resin Film and Cured Pattern Film

This was measured using the LAMBDA ACE STM-602 (which is a tradename and made by Dainippon Screen Co., Ltd.) at a refractive index of 1.629.

(3) Photosensitivity

A single crystal sapphire wafer having a diameter of 2 inches was spin-coated with a solution of the resin composition using a spin coater (1H-360S made by Mikasa Co., Ltd.), and then prebaked using a hot plate (HP-1SA made by As One Corporation) at 120° C. for 3 minutes to produce a resin composition coating film having a film thickness of 3.0 μm. The produced resin composition coating film was exposed to light using an i-line stepper (NSR-2009i9C made by Nikon Corporation) at an exposure amount of 0 to 500 mJ/cm$^2$ at 20 mJ/cm$^2$ steps. A reticle that could form a line-and-space pattern at 1, 2, 3, 4, 5, 6, 7, 8, 9, 10, 15, 20, 30, 50, and 100 μm was used for exposure. After the exposure, an automated developing device (AD-2000 made by Takizawa Sangyo K.K.) was used to carry out shower-development with an aqueous solution of 2.38% by mass tetramethyl ammonium hydroxide for 60 seconds followed by rinsing with water for 30 seconds. The lowest amount of exposure which opened 3 μm line-and-space patterns after the development was regarded as photosensitivity.

(4) Shape of Cured Pattern

A substrate underwent the steps up to development in the same manner as in (3) and was cured using a hot plate (HP-1SA made by As One Corporation) at a predetermined temperature for a predetermined period of time to form a cured pattern. The cross-section of the 3 μm line pattern obtained at an exposure amount of the photosensitivity+20 mJ was observed, and regarded as good if the cross-section is semicircular, and if not, it is regarded as not good.

(5) Dry Etching Resistance

The steps up to curing were carried out in the same manner as in (4), and the portion of the cured line pattern was used as an etching mask for a dry etching device (RIE-200iPC made by Samco Inc.) to etch the sapphire wafer at a certain temperature with boron trichloride.

Assuming that the film thicknesses of the cured pattern measured before and after the dry etching were T$_1$ and T$_2$ respectively, and that the depth of that part of the sapphire substrate which was etched through dry etching was T$_3$, an etching selection ratio (T$_1$−T$_2$)/T$_3$ was calculated, and a higher selection ratio was regarded as representing higher resistance. The selection ratio is preferably 0.7 or more, more preferably 0.8 or more, most preferably 0.9 or more, with which ratios a sapphire pattern having a higher aspect ratio can be formed after dry etching, and the pattern can achieve an enhanced light scattering effect.

(6) Post-Dry-Etching. Cured. Pattern Removability

The cured pattern obtained after dry etching was immersed in a removing liquid 106 (made by Tokyo Ohka Kogyo Co., Ltd., having a monoethanolamine to dimethyl sulfoxide ratio by mass of 70:30) at 70° C., and rinsed with water for 30 seconds. After that, an optical microscope (OPTISHOT300 made by Nikon Corporation) was used to observe the substrate, and the pattern which was removed in a shorter minimum required immersion time was regarded as having better removability.

Synthesis Example 1: Synthesis of Polyamic Acid Ester (AA-01)

Under a dry nitrogen gas stream, 15.9 g (0.043 mol) of 2,2-bis(3-amino-4-hydroxyphenyl)hexafluoropropane (BAHF made by Central Glass Co., Ltd.) and 0.62 g (0.0025 mol) of 1,3-bis(3-aminopropyl)tetramethyldisiloxane (SiDA) were dissolved in 200 g of NMP. To this, 15.5 g (0.05 mol) of 3,3',4,4'-diphenyl ether tetracarboxylic dianhydride (ODPA made by Manac Incorporated) together with 50 g of NMP was added and stirred at 40° C. for two hours. After this, 1.17 g (0.01 mol) of 4-ethynylaniline (made by Tokyo Chemical Industry Co., Ltd.) was added and stirred at 40° C. for two hours. Further, a solution having 3.57 g (0.03 mol) of dimethylfolmamidedimethyl acetal (DFA made by Mitsubishi Rayon Co., Ltd.) diluted with 5 g of NMP was added dropwise over 10 minutes, and stirred at 40° C. for two hours and at 100° C. for 0.5 hours after the dropwise addition. Upon completion of stirring, the solution was poured in 2 L of water, and a polymer solid precipitate was collected by filtration. Further, the precipitate was washed with 2 L of water 3 times, and the collected polymer solid was dried using a vacuum dryer at 50° C. for 72 hours to obtain a polyamic acid ester (AA-01). The A1, A2, and B of this polymer were 2.0, 0, 0.6 respectively, and the imide group ratio was 0.6.

Synthesis Example 2: Synthesis of Hydroxyl-Group-Containing Diamine Compound (DA-01)

Eighteen point three grams (0.05 mol) of 2,2-bis(3-amino-4-hydroxyphenyl)hexafluoropropane (BAHF made by Central Glass Co., Ltd.) was dissolved in 100 mL of acetone and 17.4 g (0.3 mol) of propylene oxide (made by Tokyo Chemical Industry Co., Ltd.) and cooled to −15° C. To this, a solution having 20.4 g (0.11 mol) of 3-nitrobenzoyl chloride (made by Tokyo Chemical Industry Co., Ltd.) dissolved in 100 mL of acetone was added dropwise. Upon completion of dropwise addition, the resulting mixture was stirred at −15° C. for four hours, and then brought back to room temperature. The precipitated white solid was collected by filtration and dried in vacuo at 50° C.

The obtained white solid (30 g) was placed in a 300 mL stainless steel autoclave and dispersed in 250 mL of Methyl Cellosolve, and to this, 2 g of 5% palladium-carbon (made by Wako Pure Chemical Industries, Ltd.) was added. Into this, hydrogen was introduced using a balloon, and the resulting mixture was allowed to undergo reduction reaction at room temperature. After about two hours, no more deflation of the balloon was ascertained to be occurring, and the reaction was terminated. Upon termination of reaction, the palladium compound, which was a catalyst, was removed by filtration, and the resulting product was concentrated using a rotatory evaporator to obtain a hydroxyl-group-containing diamine compound (DA-01) represented by the following formula.

[Chem. 17]

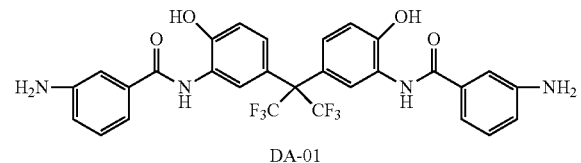

DA-01

Synthesis Example 3: Synthesis of Polyamic Acid Ester (AA-02)

Under a dry nitrogen gas stream, 25.7 g (0.043 mol) of the hydroxyl-group-containing diamine compound (DA-01) obtained in Synthesis Example 2 and 0.62 g (0.0025 mol) of 1,3-bis(3-aminopropyl)tetramethyldisiloxane (SiDA) were dissolved in 200 g of N-methylpyrrolidone (NMP). To this, 15.5 g (0.05 mol) of 3,3',4,4'-diphenyl ether tetracarboxylic dianhydride (ODPA made by Manac Incorporated) together with 50 g of NMP was added and stirred at 40° C. for two hours. After this, 1.17 g (0.01 mol) of 4-ethynylaniline (made by Tokyo Chemical Industry Co., Ltd.) was added and stirred at 40° C. for two hours. Further, a solution having 3.57 g (0.03 mol) of dimethylfolmamidedimethyl acetal (DFA made by Mitsubishi Rayon Co., Ltd.) diluted with 5 g of NMP was added dropwise over 10 minutes, and stirred at 40° C. for two hours after the dropwise addition. Upon completion of stirring, the solution was poured in 2 L of water, and a polymer solid precipitate was collected by filtration. Further, the precipitate was washed with 2 L of water 3 times, and the collected polymer solid was dried using a vacuum dryer at 50° C. for 72 hours to obtain a polyamic acid ester (AA-02). The A1, A2, and B of this polymer were 2.0, 1.9, 0.14 respectively, and the imide group ratio was 0.07.

Synthesis Example 4: Synthesis of Polyamic Acid Ester (AA-03)

A polyamic acid ester (AA-03) was obtained in the same manner as in Synthesis Example 1 except that 1.09 g of 3-aminophenol (made by Tokyo Chemical Industry Co., Ltd.) was added in place of 4-ethynylaniline. The A1, A2, and B of this polymer were 2.0, 1.9, 0.12 respectively, and the imide group ratio was 0.06.

Synthesis Example 5: Synthesis of Naphthoquinone Diazide Compound (QD-01)

This synthesis reaction was carried out under yellow light. Under a dry nitrogen gas stream, 21.23 g (0.05 mol) of TrisP-PA (which was a tradename and made by Honshu Chemical Industry Co., Ltd.) and 37.62 g (0.14 mol) of 5-naphthoquinone diazide sulfonyl acid chloride were dissolved in 450 g of 1,4-dioxane, and brought to room temperature. To this, 15.58 g (0.154 mol) of triethylamine mixed with 50 g of 1,4-dioxane was added dropwise with the system controlled to less than 35° C. After the dropwise addition, the resulting mixture was stirred at 30° C. for two hours. The triethylamine salt was filtered, and the filtrate was poured in water. Then, the deposited precipitate was collected by filtration. This precipitate was dried using a vacuum dryer to obtain a naphthoquinone diazide compound (QD-01) having the following structure.

[Chem. 18]

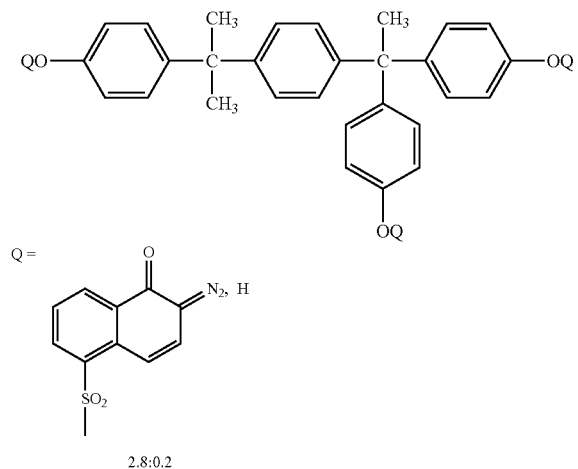

2.8:0.2

Synthesis Example 6: Synthesis of Novolac Resin (NV-01)

Under a dry nitrogen gas stream, 57 g (0.6 mol) of metacresol, 38 g (0.4 mol) of paracresol, 75.5 g of an aqueous solution of 37% by mass formaldehyde (formaldehyde: 0.93 mol), 0.63 g (0.005 mol) of oxalic acid dihydrate, and 264 g of methylisobutyl ketone were well mixed and immersed in an oil bath, and the reaction solution was allowed to undergo polycondensation reaction under reflux for 4 hours. After this, the temperature of the oil bath was raised over three hours, and then, the pressure in the flask was reduced to 30 to 50 mmHg to remove volatile matter. The resin solution was cooled to room temperature to obtain 85 g. of an alkali-soluble novolac resin (NV-01) polymer solid.

Example 1

The polyamic acid ester (AA-01) (10.00 g) (100 parts by mass) obtained in Synthesis Example 1, 1.50 g (15 parts by mass) of the naphthoquinone diazide compound (QD-01) obtained in Synthesis Example 4, 0.7 g of bis[1-ethyl(3-oxetanyl)]methyl ether, 37.8 g of GBL as a solvent were mixed, stirred, and filtered through a 0.5 μm filter to prepare a resin solution. This solution was evaluated in accordance with the above-mentioned evaluation methods (1) to (6). In this regard, the operations up to development were carried out under yellow light.

The manners of cured pattern formation, the imidization ratios, and the temperatures during dry etching are shown in Table 2. In addition, the photosensitivities, the cured pattern shapes, the etching selection ratios, and the cured pattern removabilities are shown in Table 3.

Examples 2 to 21 and Comparative Examples 1 to 6

In the same manner as in Example 1, a solution of the resin composition was adjusted and evaluated. The compositions of the solutions of the resin compositions are shown in Table 1. The manners of cured pattern formation, the imidization ratios, and the temperatures during dry etching are shown in Table 2. In addition, the photosensitivities, the cured pattern shapes, the etching selection ratios, and the cured pattern removabilities are shown in Table 3. In this regard, the compounds OX-01, OX-02, and SC-01 in Table 1 are compounds having the following structures respectively.

[Chem. 19]

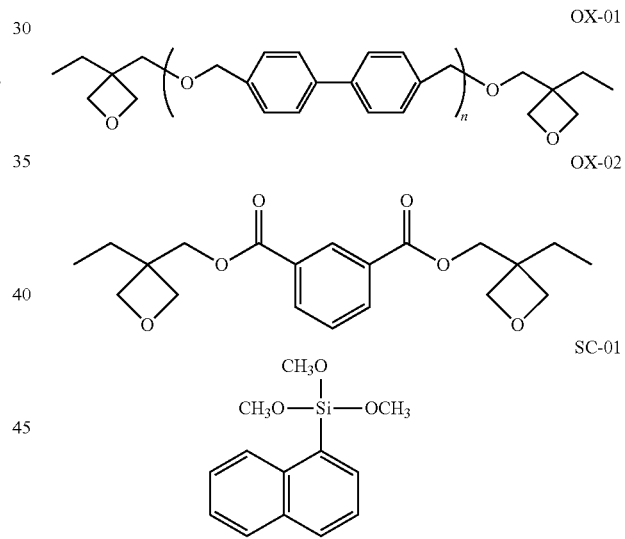

n represents an integer of 1 to 10.

TABLE 1A

| | (A) Alkali-soluble Resin | | (B) Photoacid Generator | (C) Epoxy Compound or | (D) Silane | Solvent |
|---|---|---|---|---|---|---|
| | Type | Added Amount (g) | QD-01 Added Amount (g) | Oxetane Compound (Added Amount: g) | Compound (Added Amount: g) | GBL Amount (g) |
| Example 1 | AA-01 | 10 | 1.5 | Bis[1-ethyl(3-oxetanyl)]methyl Ether (0.7) | none | 37.8 |
| Example 2 | AA-02 | 10 | 1.5 | Bis[1-ethyl(3-oxetanyl)]methyl Ether (0.7) | none | 37.8 |
| Example 3 | AA-01 | 10 | 1.5 | OX-01 (0.7) | none | 37.8 |
| Example 4 | AA-02 | 10 | 1.5 | OX-01 (0.7) | none | 37.8 |
| Example 5 | AA-03 | 10 | 1.5 | OX-01 (0.7) | none | 37.8 |
| Example 6 | AA-01 | 10 | 1.5 | OX-02 (0.7) | none | 37.8 |
| Example 7 | AA-02 | 10 | 1.5 | OX-02 (0.7) | none | 37.8 |

TABLE 1A-continued

|  | (A) Alkali-soluble Resin | | (B) Photoacid Generator | (C) Epoxy Compound or | (D) Silane | Solvent |
|---|---|---|---|---|---|---|
|  | Type | Added Amount (g) | QD-01 Added Amount (g) | Oxetane Compound (Added Amount: g) | Compound (Added Amount: g) | GBL Amount (g) |
| Example 8 | AA-01 | 10 | 1.5 | OX-02 (0.7) | SC-01 (0.2) | 37.6 |
| Example 9 | AA-02 | 10 | 1.5 | OX-02 (0.7) | SC-01 (0.2) | 37.6 |
| Example 10 | AA-01 | 10 | 1.5 | OX-01 (0.7) | none | 37.8 |
| Example 11 | AA-01 | 10 | 1.5 | OX-01 (0.7) | none | 37.8 |
| Example 12 | AA-02 | 10 | 1.5 | OX-01 (0.7) | none | 37.8 |
| Example 13 | AA-02 | 10 | 1.5 | OX-01 (0.7) | none | 37.8 |
| Example 14 | AA-02 | 10 | 1.5 | OX-01 (0.7) | none | 37.8 |

TABLE 1B

|  | (A) Alkali-soluble Resin | | (B) Photoacid Generator | (C) Epoxy Compound or | (D) Silane | Solvent |
|---|---|---|---|---|---|---|
|  | Type | Added Amount (g) | QD-01 Added Amount (g) | Oxetane Compound (Added Amount: g) | Compound (Added Amount: g) | GBL Amount (g) |
| Example 15 | AA-02 | 10 | 1.5 | OX-01 (0.7) | none | 37.8 |
| Example 16 | AA-02 | 10 | 1.5 | OX-01 (0.7) | none | 37.8 |
| Example 17 | AA-02 | 10 | 1.5 | OX-01 (0.7) | none | 37.8 |
| Example 18 | AA-02 | 10 | 1.5 | OX-01 (0.7) | none | 37.8 |
| Example 19 | AA-01 | 10 | 1.5 | OX-01 (0.7) | none | 37.8 |
| Example 20 | AA-02 | 10 | 1.5 | OX-01 (0.7) | none | 37.8 |
| Example 21 | AA-02 | 10 | 1.5 | OX-01 (0.7) | none | 37.8 |
| Comparative Example 1 | AA-02 | 10 | 1.5 | none | none | 38.5 |
| Comparative Example 2 | NV-01 | 10 | 1.5 | none | none | 38.5 |
| Comparative Example 3 | NV-01 | 10 | 1.5 | none | none | 38.5 |
| Comparative Example 4 | NV-01 | 10 | 1.5 | none | none | 38.5 |
| Comparative Example 5 | NV-01 | 10 | 1.5 | none | none | 38.5 |
| Comparative Example 6 | NV-01 | 10 | 1.5 | OX-01 (0.7) | none | 37.8 |

40

TABLE 2A

|  | Curing Conditions (° C. × ) | Oxygen Concentration in Curing | Cured Pattern | | | Imide Group Ratio | Temperature in Dry Etching (° C.) |
|---|---|---|---|---|---|---|---|
|  |  |  | A1 | A2 | B |  |  |
| Example 1 | 230 × 5 | 5 | 2 | 0 | 0.7 | 0.70 | 200 |
| Example 2 | 230 × 5 | 5 | 2 | 1.97 | 1 | 0.50 | 200 |
| Example 3 | 230 × 5 | 5 | 2 | 0 | 0.7 | 0.70 | 200 |
| Example 4 | 230 × 5 | 5 | 2 | 1.97 | 1 | 0.50 | 200 |
| Example 5 | 230 × 5 | 5 | 2 | 1.97 | 1 | 0.50 | 200 |
| Example 6 | 230 × 5 | 5 | 2 | 0 | 0.7 | 0.70 | 200 |
| Example 7 | 230 × 5 | 5 | 2 | 1.97 | 1 | 0.50 | 200 |
| Example 8 | 230 × 5 | 5 | 2 | 0 | 0.7 | 0.70 | 200 |
| Example 9 | 230 × 5 | 5 | 2 | 1.97 | 1 | 0.50 | 200 |
| Example 10 | 180 × 5 | 5 | 2 | 0 | 0.65 | 0.65 | 200 |
| Example 11 | 250 × 5 | 5 | 2 | 0 | 0.75 | 0.75 | 200 |
| Example 12 | 180 × 5 | 5 | 2 | 1.97 | 0.7 | 0.35 | 200 |
| Example 13 | 250 × 5 | 5 | 2 | 1.97 | 1 | 0.50 | 200 |
| Example 14 | 180 × 5 | 8 | 2 | 1.97 | 0.7 | 0.35 | 200 |

TABLE 2B

| | Curing Conditions (° C. × minutes) | Oxygen Concentration in Curing (%) | Cured Pattern | | | | Temperature in Dry Etching (° C.) |
| --- | --- | --- | --- | --- | --- | --- | --- |
| | | | A1 | A2 | B | Imide Group Ratio | |
| Example 15 | 180 × 5 | 10 | 2 | 1.97 | 0.7 | 0.35 | 200 |
| Example 16 | 250 × 5 | 8 | 2 | 1.97 | 1 | 0.50 | 200 |
| Example 17 | 250 × 5 | 10 | 2 | 1.97 | 1 | 0.50 | 200 |
| Example 18 | 160 × 5 | 5 | 2 | 1.97 | 0.5 | 0.25 | 200 |
| Example 19 | 270 × 5 | 5 | 2 | 0 | 0.8 | 0.80 | 200 |
| Example 20 | 230 × 5 | 5 | 2 | 1.97 | 1 | 0.50 | 150 |
| Example 21 | 230 × 5 | 5 | 2 | 1.97 | 1 | 0.50 | 100 |
| Cmnparative Example 1 | 230 × 5 | 5 | 2 | 1.97 | 1 | 0.50 | 200 |
| Comparative Example 2 | 140 × 5 | 5 | 0 | 0 | 0 | 0 | 200 |
| Comparative Example 3 | 140 × 5 | 5 | 0 | 0 | 0 | 0 | 150 |
| Comparative Example 4 | 140 × 5 | 5 | 0 | 0 | 0 | 0 | 100 |
| Comparative Example 5 | 230 × 5 | 5 | 0 | 0 | 0 | 0 | 200 |
| Comparative Example 6 | 140 × 5 | 5 | 0 | 0 | 0 | 0 | 200 |

TABLE 3A

| | Photosensitivity (mJ/cm$^2$) | Cured Pattern Shape | Etching Selection Ratio | Removability |
| --- | --- | --- | --- | --- |
| Example 1 | 400 | Good | 0.63 | 1 min. 30 sec. |
| Example 2 | 400 | Good | 0.6 | 1 min. |
| Example 3 | 400 | Good | 0.8 | 1 min. 30 sec. |
| Example 4 | 400 | Good | 0.75 | 1 min. |
| Example 5 | 400 | Good | 0.75 | 1 min. |
| Example 6 | 350 | Good | 0.85 | 1 min. 30 sec. |
| Example 7 | 350 | Good | 0.85 | 1 min. |
| Example 8 | 300 | Good | 0.9 | 1 min. 30 sec. |
| Example 9 | 300 | Good | 0.9 | 1 min. |
| Example 10 | 350 | Good | 0.76 | 1 min. 30 sec. |
| Example 11 | 350 | Good | 0.82 | 10 min. |
| Example 12 | 350 | Good | 0.72 | 45 sec. |
| Example 13 | 350 | Good | 0.78 | 1 min. |
| Example 14 | 350 | Good | 0.6 | 3 min. |

TABLE 3B

| | Photosensitivity (mJ/cm$^2$) | Cured Pattern Shape | Etching Selection Ratio | Removability |
| --- | --- | --- | --- | --- |
| Example 15 | 350 | Good | 0.6 | 5 min. |
| Example 16 | 350 | Good | 0.65 | 4 min. |
| Example 17 | 350 | Good | 0.65 | 7 min. |
| Example 18 | 350 | Good | 0.55 | 30 sec. |
| Example 19 | 350 | Good | 0.88 | 12 hours |
| Example 20 | 350 | Good | 0.7 | 1 min. |
| Example 21 | 350 | Good | 0.65 | 1 min. |
| Comparative Example 1 | 400 | Not Good | 0.6 | 1 min. |
| Comparative Example 2 | 400 | Good | Not Measurable (Resist Burning: Shape Destruction due to Resist Decomposition) | Not Removable |
| Comparative Example 3 | 400 | Good | Not Measurable (Distortion of Resist Shape) | Not Removable |
| Comparative Example 4 | 400 | Good | Not Measurable (Distortion of Resist Shape) | Not Removable |
| Comparative Example 5 | 400 | Not Good (Pattern Lost) | Not Measurable | Not Removable |
| Comparative Example 6 | 400 | Good | Not Measurable (Resist Burning: Shape Destruction due to Resist Decomposition) | Not Removable |

REFERENCE SIGNS LIST

1: Substrate
2: Pattern

The invention claimed is:

1. A method of producing a patterned substrate, the method comprising the steps of:
providing, on a substrate, a coating film of a resin composition including
(A) an alkali-soluble resin selected from the group consisting of polyimides (a-1), polyamideimides (a-2), polyimide precursors (a-3), polyamideimide precursors (a-4), polybenzoxazoles (a-5), polybenzoxazole precursors (a-6), copolymers of at least two of (a-1) to (a-6), and copolymers of at least one of (a-1) to (a-6) and another structural unit,
(B) a photoacid generator, and
(C) at least one compound selected from the group consisting of epoxy compounds and oxetane compounds;
forming a pattern of the coating film;
patterning the substrate through etching using the pattern of the coating film as a mask; and
removing the coating film of the resin composition,
wherein the step of forming the pattern of the coating film of the resin composition comprises a step of curing a patterned coating film,
wherein the cured pattern of the coating film of the resin composition contains an amide group and an imide group, and
wherein the molar ratio of the amide group to the imide group is as follows: 0.3≤imide group/(amide group+ imide group)≤0.7.

2. The method of producing a substrate according to claim 1, wherein the alkali-soluble resin has, as a main component, a structural unit represented by the general formula (1):

[Chem. 1]

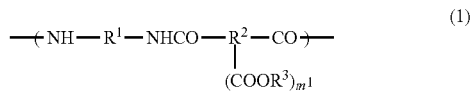

(1)

(wherein in the general formula (1),
$R^1$ represents a $C_2$-$C_{50}$ bivalent organic group;
$R^2$ represents a $C_2$-$C_{50}$ trivalent or tetravalent organic group;
$R^3$ represents a hydrogen atom or a $C_1$-$C_{10}$ organic group; and
$m^1$ is an integer of 1 or 2).

3. The method of producing a substrate according to claim 2, wherein, in the general formula (1), $R^1$ has a structure represented by the following general formula (3):

[Chem. 2]

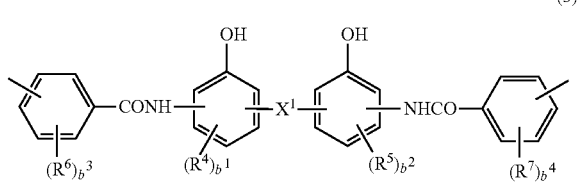

(3)

(wherein in the general formula (3),
$R^4$ to $R^7$ independently represent a halogen atom or a $C_1$-$C_3$ monovalent organic group;

$X^1$ is a single bond, O, S, NH, SO$_2$, CO, a $C_1$-$C_3$ bivalent organic group, or a bivalent group which is two or more of these moieties bound together;
$b^1$ and $b^2$ are integers of 0 to 3, and
$b^3$ and $b^4$ are integers of 0 to 4).

4. The method of producing a substrate according to claim 1, wherein the (C) component contains an oxetane compound, and wherein the oxetane compound has a structure represented by the following general formula (10) or (11):

[Chem. 3]

(10)

(11)

(wherein n represents an integer of 1 to 10).

5. The method of producing a substrate according to claim 1,
wherein the resin composition further contains (D) a silane compound represented by the general formula (12) or a hydrolytic condensate thereof:

(12)

(wherein in the general formula (12),
$R^8$ represents a fused polycyclic aromatic hydrocarbon group, and a hydrogen atom(s) of the fused polycyclic aromatic hydrocarbon group may be substituted with a hydroxyl group(s), an alkyl group(s), an alkenyl group(s), or an alkoxy group(s);
$R^9$ represents a hydrogen atom or a $C_1$-$C_6$ alkyl group; and
s represents an integer of 1 to 3).

6. The method of producing a substrate according to claim 1, wherein the step of curing the coating film is a step of heating the coating film at 180° C. to 250° C. under an atmosphere having an oxygen concentration of 5% or less.

7. The method of producing a substrate according to claim 1, wherein the substrate comprises at least one element selected from the group consisting of aluminum, silicon, titanium, tantalum, gallium, germanium, iron, nickel, zinc, indium, boron, manganese, phosphorus, cobalt, and zirconium.

8. The method of producing a substrate according to claim 7, wherein the substrate is selected from the group consisting of sapphire (Al$_2$O$_3$), silicon (Si), silicon oxide (SiO$_2$), silicon nitride (SiN), gallium nitride (GaN), silicon carbide (SiC), gallium arsenide (GaAs), indium phosphide (InP), aluminum nitride (AlN), tantalum nitride (TaN), lithium tantalate (LiTaO$_3$), boron nitride (BN), titanium nitride (TiN), and barium titanate (BaTiO$_3$).

9. The method of producing a substrate according to claim 1, wherein the step of patterning the coating film of the resin composition comprises the steps of:
   carrying out photolithography using light having a wavelength of 350 nm or more but 450 nm or less; and
   carrying out development.

10. The method of producing a substrate according to claim 1, wherein the pattern of the coating film of the resin composition has a semicircular cross-section.

11. The method of producing a substrate according to claim 1, wherein the etching is dry etching.

12. The method of producing a substrate according to claim 11, wherein the dry etching is carried out at a temperature of 100° C. to 250° C.

13. A method of producing a light emitting element, the method comprising the step of forming, on the substrate obtained using the method according to claim 1, at least one layer selected from the group consisting of a buffer layer composed of GaN or AlN, an n-type GaN layer, an InGaN light emitting layer, a p-type AlGaN clad layer, and a p-type GaN contact layer.

14. A method of producing a patterned substrate, the method comprising the steps of:
   providing, on a substrate, a coating film of a resin composition including
   (A) an alkali-soluble resin selected from the group consisting of polyimides (a-1), polyamideimides (a-2), polyimide precursors (a-3), polyamideimide precursors (a-4), polybenzoxazoles (a-5), polybenzoxazole precursors (a-6), copolymers of at least two of (a-1) to (a-6), and copolymers of at least one of (a-1) to (a-6) and another structural unit,
   (B) a photoacid generator, and
   (C) at least one compound selected from the group consisting of epoxy compounds and oxetane compounds;
   forming a pattern of the coating film;
   patterning the substrate through etching using the pattern of the coating film as a mask; and
   removing the coating film of the resin composition,
   wherein the step of forming the pattern of the coating film of the resin composition comprises a step of curing a patterned coating film,
   wherein the cured pattern of the coating film of the resin composition contains an amide group and an imide group, and
   wherein the resin composition further contains (D) a silane compound represented by the general formula (12) or a hydrolytic condensate thereof:

$$(R^8)_s Si(-OR^9)_{4-s} \qquad (12)$$

wherein in the general formula (12),
R$^8$ represents a fused polycyclic aromatic hydrocarbon group, and a hydrogen atom(s) of the fused polycyclic aromatic hydrocarbon group may be substituted with a hydroxyl group(s), an alkyl group(s), an alkenyl group(s), or an alkoxy group(s);
R$^9$ represents a hydrogen atom or a C$_1$-C$_6$ alkyl group; and
s represents an integer of 1 to 3.

* * * * *